(12) United States Patent
Nakano et al.

(10) Patent No.: US 9,008,166 B2
(45) Date of Patent: Apr. 14, 2015

(54) FILTER CALCULATING DEVICE, TRANSMITTING DEVICE, RECEIVING DEVICE, PROCESSOR, AND FILTER CALCULATING METHOD

(75) Inventors: Hiroshi Nakano, Osaka (JP); Hiromichi Tomeba, Osaka (JP); Takashi Onodera, Osaka (JP); Alvaro Ruiz Delgado, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/113,135

(22) PCT Filed: Apr. 2, 2012

(86) PCT No.: PCT/JP2012/058926
§ 371 (c)(1),
(2), (4) Date: Oct. 21, 2013

(87) PCT Pub. No.: WO2012/144313
PCT Pub. Date: Oct. 26, 2012

(65) Prior Publication Data
US 2014/0064354 A1    Mar. 6, 2014

(30) Foreign Application Priority Data

Apr. 22, 2011    (JP) ................................ 2011-096183

(51) Int. Cl.
*H03H 17/02*    (2006.01)
*H04J 11/00*    (2006.01)
(Continued)

(52) U.S. Cl.
CPC ............ *H03H 17/0248* (2013.01); *H04J 11/00* (2013.01); *H04L 25/0391* (2013.01); *H04L 25/03955* (2013.01); *H04L 2025/03414* (2013.01); *H04B 7/0456* (2013.01); *H04L 25/03949* (2013.01); *H04L 25/03159* (2013.01); *H04B 7/0413* (2013.01); *H04B 7/068* (2013.01)

(58) Field of Classification Search
CPC ................ H03H 17/0248; H04J 11/00; H04L 25/03891; H04L 25/0391; H04L 25/03949; H04L 2025/03433; H04L 2025/03445; H04L 2025/03522; H04L 2201/00
USPC ......... 375/260, 261, 262, 265, 267, 231–233, 375/340, 343, 346, 350; 370/208, 210; 708/400, 401, 402, 403, 404, 405
See application file for complete search history.

(56) References Cited

U.S. PATENT DOCUMENTS 8,199,841 B1 *   6/2012   Sarrigeorgidis et al. ...... 375/267
2007/0253476 A1 *  11/2007   Tirkkonen et al. ............ 375/230
(Continued)

OTHER PUBLICATIONS

Official Communication issued in International Patent Application No. PCT/JP2012/058926, mailed on Jun. 26, 2012.
(Continued)

*Primary Examiner* — Young T Tse
(74) *Attorney, Agent, or Firm* — Keating & Bennett, LLP

(57) ABSTRACT

A filter calculating device includes a first equalization filter calculating section that generates at least a first conversion matrix and a first triangular matrix based on a channel state of a first channel; a first quasi-orthogonalization section that calculates a first unimodular matrix based on the first triangular matrix; and a second equalization filter calculating section that generates at least a second conversion matrix and a second triangular matrix based on a channel state of a second channel and the first unimodular matrix.

9 Claims, 22 Drawing Sheets

(51) Int. Cl.
*H04L 25/03* (2006.01)
*H04B 7/04* (2006.01)
*H04B 7/06* (2006.01)

(56) References Cited

U.S. PATENT DOCUMENTS

| | | | | |
|---|---|---|---|---|
| 2007/0268981 | A1* | 11/2007 | Heiskala | 375/267 |
| 2009/0109947 | A1* | 4/2009 | Sheng et al. | 370/342 |
| 2010/0040154 | A1* | 2/2010 | Carbonelli et al. | 375/260 |
| 2010/0067600 | A1* | 3/2010 | Kim et al. | 375/267 |
| 2011/0096853 | A1* | 4/2011 | Jayaraman et al. | 375/260 |
| 2011/0286502 | A1* | 11/2011 | Adachi et al. | 375/219 |
| 2014/0010375 | A1* | 1/2014 | Usher et al. | 381/27 |

OTHER PUBLICATIONS

3GPP TS 36.211, V8.9.0, "3rd Generation Partnership Project; Technical Specification Group Radio Access Network; Evolved Universal Terrestrial Radio Access (E-UTRA); Physical Channels and Modulation (Relaease 8)", Dec. 2009, p. 52.

Hochwald et al., "A Vector-Perturbation Technique for Near-Capacity Multiantenna Multiuser Communication—Part II: Perturbation", IEEE Transactions on Communications, vol. 53, No. 3, Mar. 2005, pp. 537-544.

Nakano et al., "Joint Quasi-orthogonalization for Nonlinear Precoding MU-MIMO", IEICE Technical Report, RCS 2010-183, Dec. 2010, pp. 145-150.

Liu et al., "Low complexity lattice reduction aided MMSE precoding design for MIMO systems", Proceedings of ICC, Jun. 2007, 5 pages.

Wuebben et al., "Near-Maximum-Likelihood Detection of MIMO Systems using MMSE-Based Lattice-Reduction", IEEE Transactions on Communications, vol. 2, Jun. 2004, pp. 798-802.

Murray et al., "Performance and Complexity of Adaptive Lattice Reduction in Fading Channels", Communications Theory Workshop, AusCTW 2009, Feb. 2009, pp. 1-6.

* cited by examiner

FIG. 11

---
TRIANGULATION SECTION
---

0: Input $H^H$
1: $R_I = 0$, $Q_I = H^H$, $S = [1, 2, \cdots, N]$
2: for $i = 1, \ldots, N$
3:     $k_i = \text{argmin}_{(m=i,\cdots,N)} \|Q_I(:,m)\|^2$
4:     $[Q_I(:,k_i), Q_I(:,i)] = [Q_I(:,i), Q_I(:,k_i)]$
5:     $[R_I(:,k_i), R_I(:,i)] = [R_I(:,i), R_I(:,k_i)]$
6:     $[S(k_i), S(i)] = [S(i), S(k_i)]$
7:     $R_I(i,i) = \|Q_I(:,i)\|$
8:     $Q_I(:,i) = Q_I(:,i)/R_I(i,i)$
9:     for $m = i+1, \cdots, N$
10:         $R_I(i,m) = Q_I(:,i)^H Q_I(:,m)$
11:         $Q_I(:,m) = Q_I(:,m) - R(i,m) Q_I(:,i)$
12:     end
13: end
14: $\Pi_I = I_N(:,S)$
15: Output $Q_I$, $R_I$, $\Pi_I$

---
QUASI-ORTHOGONALIZATION SECTION
---

0: Input $R_I$, $\Pi_I(T)$
1: $M = I_N$, $R_L = R_I$
2: for $k = 2, \ldots, N$
3:     for $i = k-1, \ldots, 1$
4:         $\mu = \text{"}R_L(i,k)/R_L(i,i)\text{"}$
5:         $R_L(1:i,k) = R_L(1:i,k) - \mu R_L(1:i,i)$
6:         $M(:,k) = M(:,k) - \mu M(:,i)$
7:     end
8: end
9: $U = \Pi_I M$ ($U = TM$)
10: Output $U$

---

---
THP FILTER CALCULATING SECTION
---
0: Input H, U
1: $G^H = H^H U$
2: $[Q_T, R_T, \Pi_T] = SQRD(G^H)$
3: $A = diag(R_T)$
4: $P = Q_T A^{-1}$
5: $F = R_T^H A^{-1} - I_N$
6: $T = U\Pi_T$
7: Output P, F, T, $R_T$
---

```
------------------------------------------
DFE FILTER CALCULATING SECTION
------------------------------------------
0: Input H, U
1: G = HU
2: [$Q_T$, $R_T$, $\Pi_T$] = SQRD(G)
3: T = U$\Pi_T$
4: Output $Q_T$, $R_T$, T
------------------------------------------
```

```
------------------------------------
LR-DFE SECTION
------------------------------------
0: Input y, $Q_T$, $R_T$, T
1: $y_T$ = $Q_T^H$y
2: for k = N,···,1
3:     $f_k$=$R_T$(k,k+1:N)c(k+1:N)
4:     c(k)="($y_T$(k) − $f_k$)/$R_T$(k,k)/$\Delta$"$\Delta$
5: end
6: d=$T^{-1}$c
7: Output d
------------------------------------
```

FIG. 25

---
QUASI-ORTHOGONALIZATION SECTION
---

0: Input $R_I, \Pi_I$ (T)
1: $M=I_N, R_L=R_I$
2: k=1;
3: while k≤N
4:     for i=k-1,...,1
5:         $\mu$="$R_L(i,k)/R_L(i,i)$"
6:         $R_L(1:i,k)=R_L(1:i,k) - \mu R_L(1:i,i)$
7:         $M(:,k)=M(:,k)-\mu M(:,i)$
8:     end
9:     if $\delta |R_L(k-1,k-1)|^2 \geq |R_L(k,k)|^2+|R_L(k-1,k)|^2$
10:         Switch (k-1)-th and k-th columns in $R_L$ and M
11:         $R_L(k-1:k,:)=GR_L(k-1:k,:)$
12:         k=max(k-1,1)
13:     else
14:         k=k+1
15:     end
16: end
17: $U = \Pi_I M$ (U = TM)
18: Output U

---

$$\left. \begin{array}{l} G = \begin{bmatrix} \alpha & \beta^* \\ -\beta & \alpha \end{bmatrix} \\ \alpha = \dfrac{\sqrt{|R_L(k-1,k-1)|^2}}{\sqrt{|R_L(k-1,k-1)|^2 + |R_L(k,k-1)|^2}} \\ \beta = \alpha \dfrac{R_L(k,k-1)}{R_L(k-1,k-1)} \end{array} \right\} \text{GIVENS ROTATION MATRIX G}$$

FIG. 26

---
THP FILTER CALCULATING SECTION
---

0: Input H, U
1: $G^H = H^H U$, $\Pi_T = I_N$
2: $\kappa = \{1, 2, \cdots, N\}$
3: $G' = G$
4: for $i = N, \cdots, 1$
5:     $P = G'^+$
6:     $k_i = \text{argmin}_{(k \in \kappa)} \|P(:,k)\|^2$
7:     $p_i = P(:, k_i)$
8:     $F(:, i) = e_{k_i} - G p_i$
9:     $\kappa = \kappa \backslash \{k_i\}$
10:    $G'(:, k_i) = 0$
11: end
12: $P = [p_1, p_2, \cdots, p_N]$
13: $\Pi_T = \Pi_T(:, [k_1, \cdots, k_i, \cdots, k_N])$
14: $T = U \Pi_T$
15: $R_T = (I - \Pi_T^H F)^H$
16: Output P, F, T, $R_T$
---

FILTER CALCULATING DEVICE, TRANSMITTING DEVICE, RECEIVING DEVICE, PROCESSOR, AND FILTER CALCULATING METHOD

TECHNICAL FIELD

The present invention relates to filter calculating devices, transmitting devices, receiving devices, processors, and filter calculating methods.

BACKGROUND ART

<MIMO>

In recent years, in order to achieve higher speed in wireless data communication in a limited frequency band, many kinds of research have been performed for improving frequency utilization efficiency. Among these kinds, a MIMO (multi-input multi-output) technology that simultaneously uses multiple antennas to increase the transmission capacity per unit frequency is gaining attention.

<LP MU-MIMO>

Known examples of MIMO include single-user MIMO (SU-MIMO) in which a base station (BS) transmits multiple signals at the same time and with the same frequency to a single terminal (mobile station: MS) and multi-user MIMO (MU-MIMO) in which the base station transmits signals at the same time and with the same frequency to different terminal devices.

In SU-MIMO, since the number of streams that can be multiplexed cannot be larger than the number of antennas included in a terminal device, the maximum number of streams is limited by the number of physical antennas in the terminal device. On the other hand, since the base station can have a larger number of antennas than the terminal device, MU-MIMO is also essential to make best use of antennas remaining in the base station. In LTE and LTE-Advanced, downlink (DL) MU-MIMO that uses linear precoding (LP) has already been put into practical use (see Non Patent Literature 1).

<NLP MU-MIMO>

However, with MU-MIMO that uses LP (LP MU-MIMO), the base station needs to remove multi-user interference (MUI) by multiplying linear filters to orthogonalize transmission signals, resulting in lower flexibility in terms of combinations of terminal devices that can be spatially-multiplexed.

As another method for achieving spatial multiplexing, non-linear precoding (NLP) MU-MIMO is proposed. In NLP MU-MIMO, each terminal device performs modulo calculation in which points obtained by translating a reception signal toward an in-phase channel (I-ch) and a quadrature channel (Q-ch) by an integral multiple of a fixed width (modulo width) are regarded as the same point. Therefore, since the base station becomes capable of adding a signal (perturbation vector) corresponding to an arbitrary integral multiple of the modulo width to a modulation signal, the base station appropriately selects a perturbation vector that allows for lower transmission power and adds the perturbation vector to a signal destined for each terminal device (see Non Patent Literature 2).

<VP MU-MIMO>

When a terminal device performs modulo calculation on a reception signal, the base station becomes free to add a signal corresponding to an arbitrary integral multiple of the modulo width to each modulation signal. This addable signal is called a perturbation vector. A VP (vector perturbation) MU-MIMO method is a method of performing a full search in view of the channel states of all terminal devices that are subject to spatial multiplexing so as to find a perturbation vector that achieves the most improved power efficiency. VP MU-MIMO requires a large amount of calculation by the base station but can achieve a full transmission diversity gain, and is an NLP MU-MIMO method that exhibits extremely good characteristics (see Non Patent Literature 2).

<THP MU-MIMO>

Unlike VP MU-MIMO, THP MU-MIMO is a method of sequentially calculating perturbation vectors to be added to signals destined for the individual terminal devices in view of multi-user interference affecting each terminal device. Although THP MU-MIMO allows for lower complexity of transmission processing performed by the base station, a full transmission diversity cannot be achieved for all of the terminal devices (see Non Patent Literature 2).

<Ordering THP MU-MIMO>

Although THP MU-MIMO removes the interference affecting the terminal devices subject to spatial multiplexing in a certain order for the individual terminal devices, the characteristics can be improved by optimizing the order in which the interference is removed. One of the technologies that exhibit good characteristics is a vertical-bell laboratories space-time THP (VBLAST-THP) technology (see Non Patent Literature 3). Furthermore, as a technology for reducing the amount of calculation in VBLAST-THP, a sorted QR decomposition (SQRD) THP technology is known (see Non Patent Literature 3).

<LR-THP>

An LR-THP method is a method of adding processing called lattice reduction (LR) to THP MU-MIMO so as to achieve a full transmission diversity gain with an amount of calculation smaller than that in VP MU-MIMO. As a lattice reduction algorithm, a method that uses LLL-algorithm (Lenstra-Lenstra-Lovasz algorithm: LLLA) and a method that uses a joint quasi-orthogonalization: JQO) are proposed (see Non Patent Literature 3 and Non Patent Literature 4).

<LR-DFE>

Non Patent Literature 5 discusses a decision feedback equalizer (DFE) using LR in SU-MIMO, that is, LR-DFE. Although LR-DFE is a technology for the reception side, it is also an equalization technology of sequentially performing signal detection after performing LR, and filter calculation processing is similar to LR-THP. LR-DFE is a technology that improves the characteristics by performing DFE in the related art after enhancing the orthogonality of a channel matrix by LR at the reception side (see Non Patent Literature 5).

<SQRD-LLLA>

Although LLLA is often used in LR commonly used for LR-THP and LR-DFE, SQRD-LLLA is known as an algorithm proposed as a method for reducing the amount of calculation in this LLLA. In SQRD-LLLA, sorted QR decomposition (SQRD) is performed on a channel matrix, which indicates a MIMO channel, before performing LLLA. In this case, SQRD is an algorithm that decomposes a channel matrix into a unitary matrix and a triangular matrix that tends to become smaller toward the upper left side. By performing this SQRD before LLLA, the amount of calculation in LLLA is reduced (see Non Patent Literature 5).

<Adaptive LLL-Algorithm (ALLL)>

An adaptive LLL-algorithm (ALLL) is known as an algorithm proposed as a method for reducing the amount of calculation in LLLA. ALLL is a technology based on MIMO with multiple temporally successive symbols. In this algorithm, rather than performing LLLA individually on channel matrices expressing the states of channels for the respective symbols, the result of LLLA for one previous symbol is utilized so as to reduce the amount of calculation in LLLA for the subsequent symbol (see Non Patent Literature 6).

CITATION LIST

Non Patent Literature

NPL 1: 3GPP Technical Specification 36.211 v8.9.0
NPL 2: B. M. Hochwald, C. B. Peel, A. L. Swindlehurst, "A Vector-Perturbation Technique for Near-Capacity Multi-antenna Multiuser Communication—Part II Perturbation", IEEE Transactions on Communications, Vol. 53, No. 3, pp. 537-544, March 2005
NPL 3: Hiroshi Nakano, Hiromichi Tomeba, Ruiz Delgado Alvaro, Takashi Onodera, Minoru Kubota, "Joint Quasi-Orthogonalization for Nonlinear Precoding MU-MIMO", IEICE Technical Report, RCS 2010-183, December 2010
NPL 4: F. Liu, L. Jiang, C. He, "Low complexity lattice reduction aided MMSE precoding design for MIMO systems", Proceedings of ICC 2007, pp. 2598-2603, June 2007
NPL 5: D. Wubben, R. Bohnke, V. Kuhn, K-D. Kammeyer, "Near-Maximum-Likelihood Detection of MIMO Systems using MMSE-Based Lattice Reduction", IEEE Conference on Communications, vol. 2, pp. 798-802, June 2004
NPL 6: A. T. Murray, S. R. Weller, "Performance and Complexity of Adaptive Lattice Reduction in Fading Channels", Communications Theory Workshop, AusCTW 2009, pp. 4-7, February 2009

SUMMARY OF INVENTION

Technical Problem

In the LR-THP method in DL MU-MIMO, a channel matrix H undergoes LR so as to be converted into an equivalent-channel matrix G having high orthogonality. After LR, THP, which is a sequential interference removal method, is performed on the equivalent channel matrix G, so that a signal destined for each terminal device can be transmitted with higher power efficiency as compared with normal THP. Because the channel matrix H varies from subcarrier to subcarrier, filter calculation processing used in LR-THP needs to be performed for the number of subcarriers. Since this filter calculation processing requires a large amount of calculation, there is a problem in terms of practical application of LR-THP even by using the LR calculation-amount reduction technologies according to Non Patent Literatures 3, 4, 5, and so on.

In DFE processing (LR-DFE) that uses LR processing of SU-MIMO, as discussed in Non Patent Literature 5, filters to be used for LR and DFE need to be calculated for each subcarrier, resulting in a large amount of calculation.

In view of these circumstances, an object of the present invention is to reduce the amount of calculation in LR-THP and LR-DFE filter calculation processing.

Solution to Problem

According to an aspect of the present invention, there is provided a filter calculating device including a first equalization filter calculating section that generates at least a first conversion matrix and a first triangular matrix based on a channel state of a first channel; a first quasi-orthogonalization section that calculates a first unimodular matrix based on the first triangular matrix; and a second equalization filter calculating section that generates at least a second conversion matrix and a second triangular matrix based on a channel state of a second channel and the first unimodular matrix.

It is preferable that the first conversion matrix be expressed by a product of a second unimodular matrix used for performing quasi-orthogonalization on the first channel and a first permutation matrix calculated by the first equalization filter calculating section. The first channel and the second channel may be channels that adjoin each other in a frequency domain, or may be channels that adjoin each other in a time domain.

It is preferable that a third equalization filter calculating section be further provided, which generates a third conversion matrix and a third triangular matrix based on the first unimodular matrix and a channel state of a third channel that adjoins the first channel and that is different from the second channel.

Furthermore, the present invention provides a transmitting device that transmits different signals with the same frequency and at the same time to a plurality of receiving devices. The transmitting device includes the aforementioned filter calculating device; a nonlinear precoding section that performs nonlinear precoding on the signal to be transmitted via the first channel based on the first conversion matrix and the first triangular matrix, and that performs nonlinear precoding on the signal to be transmitted via the second channel based on the second conversion matrix and the second triangular matrix; and a transmitting section that transmits the signals having undergone the nonlinear precoding by the nonlinear precoding section.

In the above description, it is preferable that a communication band be divided into a plurality of bands, and filter calculation be performed for each divided band by using the filter calculating device. The divided bands may be set based on a correlation between the channel states of the channels.

Furthermore, the present invention provides a receiving device that receives a plurality of different signals transmitted with the same frequency and at the same time by a transmitting device. The receiving device includes the aforementioned filter calculating device and an LR-DFE section that performs decision-feedback signal detection on the signal received via the first channel based on the first conversion matrix and the first triangular matrix, and that performs decision-feedback signal detection on the signal to be transmitted via the second channel based on the second conversion matrix and the second triangular matrix.

Furthermore, the present invention provides a processor that includes a first equalization filter calculating section that generates a first conversion matrix and a first triangular matrix based on a channel state of a first channel; a first quasi-orthogonalization section that calculates a first unimodular matrix based on the first conversion matrix and the first triangular matrix; and a second equalization filter calculating section that generates a second conversion matrix and a second triangular matrix based on a channel state of a second channel and the first unimodular matrix.

According to another aspect of the present invention, a filter calculating method includes a first equalization filter calculating step for generating a first conversion matrix and a first triangular matrix based on a channel state of a first channel; a first quasi-orthogonalization step for calculating a first unimodular matrix based on the first conversion matrix and the first triangular matrix; and a second equalization filter calculating step for generating a second conversion matrix and a second triangular matrix based on a channel state of a second channel and the first unimodular matrix.

The present invention may be a program for causing a computer to execute the filter calculating method, or may be a computer-readable storage medium that stores the program.

The present specification encompasses the contents of the specification and/or the drawings of Japanese Patent Application No. 2011-096183, which serves as the basis for the right of priority for the present application.

Advantageous Effects of Invention

According to the present invention, the amount of calculation in LR-THP and LR-DFE filter calculation processing can be reduced.

BRIEF DESCRIPTION OF DRAWINGS

FIG. 11 illustrates the procedure of SQRD.

FIG. 12 illustrates the procedure for calculating a unimodular matrix by performing quasi-orthogonalization in a quasi-orthogonalization section.

FIG. 25 illustrates a modification of processing performed in a quasi-orthogonalization section.

FIG. 26 illustrates VBLAST-THP replacing an SQRD-THP algorithm based on FIG. 13.

DESCRIPTION OF EMBODIMENTS

First Embodiment

This embodiment discloses a method for reducing the amount of calculation for LR-THP in DL MU-MIMO.

<Communication System 1>

Figure 1:
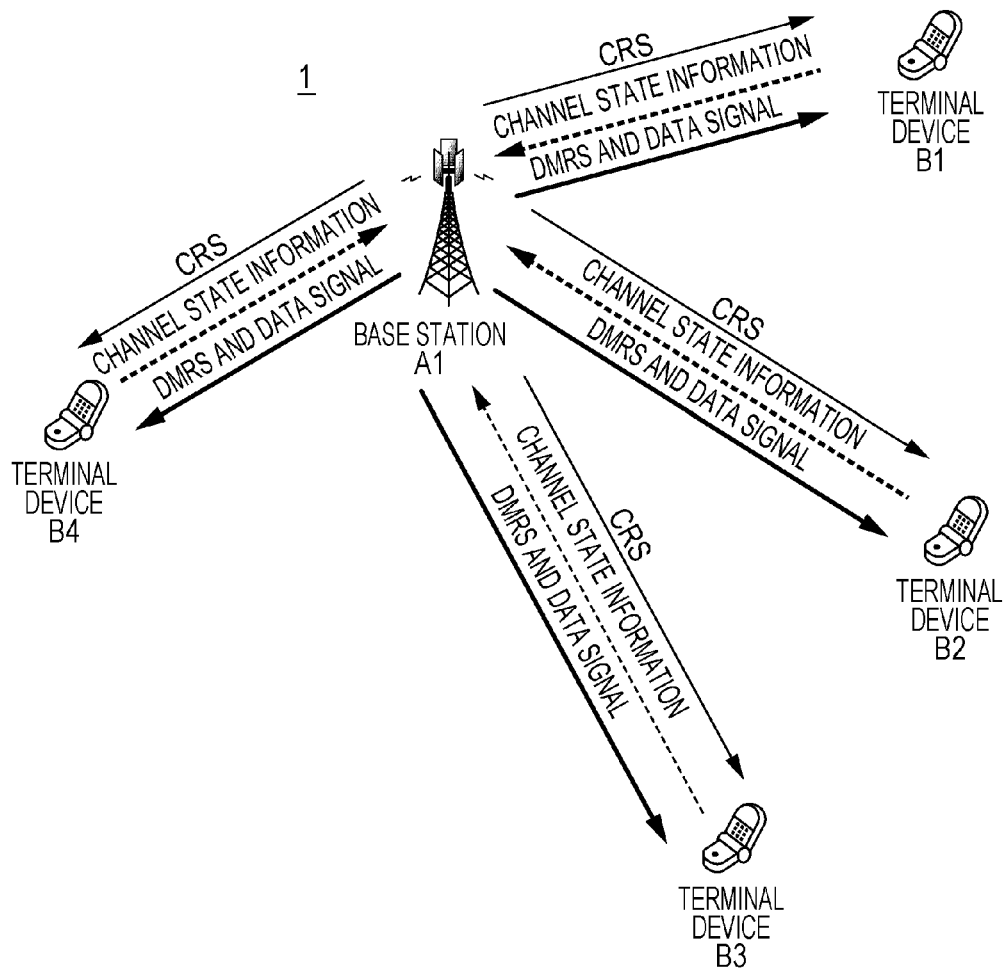
FIG. 1 schematically illustrates an example of a communication system 1 according to a first embodiment of the present invention.

FIG. 1 schematically illustrates an example of a communication system 1 according to a first embodiment of the present invention. The communication system 1 includes a base station A1 and first to N-th terminal devices B1 to BN. FIG. 1 illustrates an example in which the base station A1 has selected first to fourth terminal devices B1, B2, B3, and B4 (N=4). First, the base station A1 transmits a common reference signal (referred to as "CRS"). A CRS is a signal stored in advance in each of the base station A1 and the terminal devices B1 to B4 and indicating a signal point (reference signal) thereof. Each of the terminal devices B1 to B4 estimates a channel state on the basis of the CRS transmitted from the base station A1 and approximates the estimated channel state value to a predetermined value. Each of the terminal devices B1 to B4 notifies the base station A1 of channel state information indicating the approximated channel state value.

The base station A1 transmits a DMRS (demodulation reference signal) and a data signal to each of the terminal devices B1 to B4. In this case, the base station A1 performs nonlinear precoding on the data signal and transmits the non-linear-precoded data signal. The DMRS is also transmitted to each of the terminal devices B1 to B4.

Each of the multiplexed terminal devices B1 to B4 estimates the channel state of an equivalent channel that regards nonlinear precoding processing as a part of the channel (which will simply be referred to as "equivalent channel" hereinafter) on the basis of the DMRS received from the base station A1, and detects the data signal on the basis of estimated equivalent channel state information indicating the channel state of the estimated equivalent channel.

Figure 2:
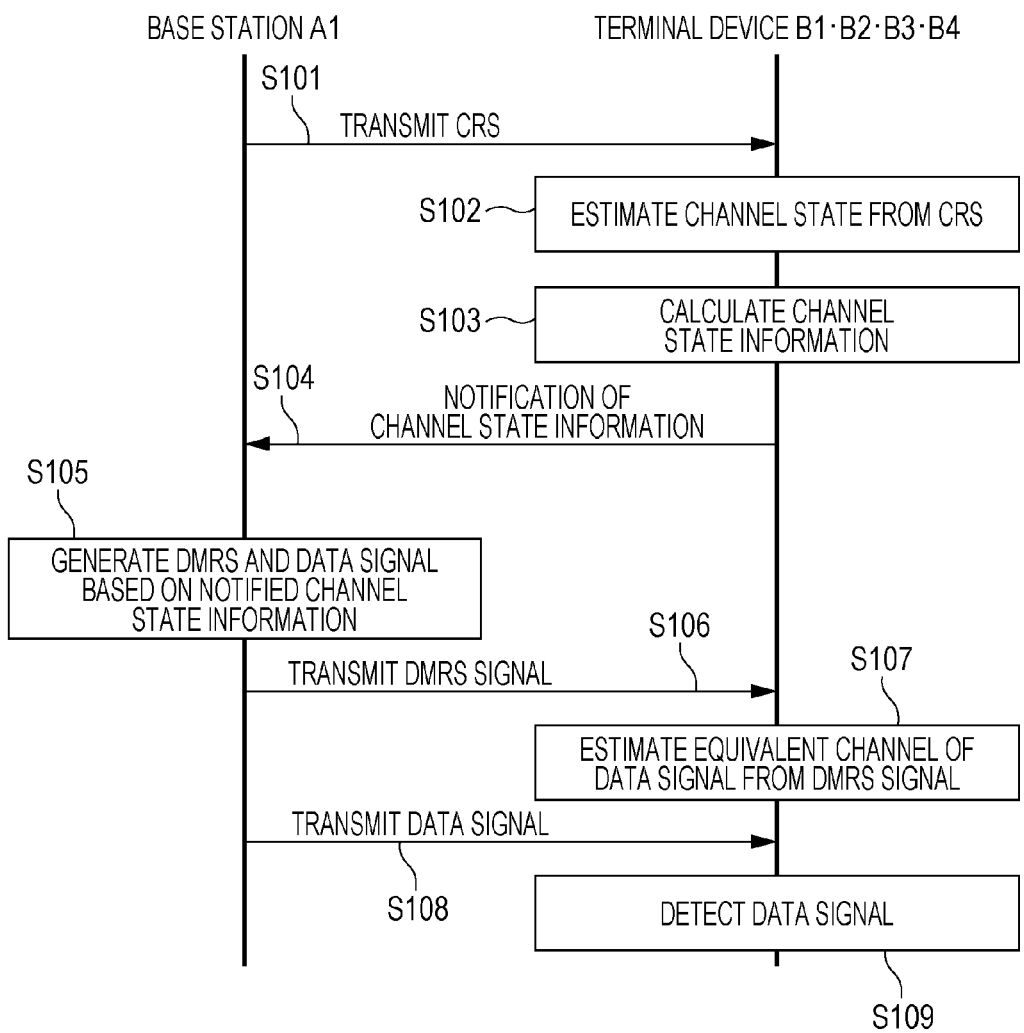
FIG. 2 is a sequence diagram illustrating an example of operation performed in the communication system 1 according to the first embodiment.

FIG. 2 is a sequence diagram illustrating an example of operation performed in the communication system 1 according to this embodiment. In this diagram, the operation of the communication system 1 in FIG. 1 is illustrated.

(Step S101) The base station A1 transmits a CRS. Subsequently, the operation proceeds to step S102.

(Step S102) Each of the terminal devices B1 to B4 estimates the channel state on the basis of the received CRS transmitted in step S101. Subsequently, the operation proceeds to step S103.

(Step S103) Each of the terminal devices B1 to B4 calculates channel state information indicating the channel state on the basis of the channel state estimated in step S102. Subsequently, the operation proceeds to step S104.

(Step S104) Each of the terminal devices B1 to B4 notifies the base station A1 of the channel state information calculated in step S103. Subsequently, the operation proceeds to step S105.

(Step S105) The base station A1 performs nonlinear precoding on a data signal on the basis of the channel state information notified in step S104. Subsequently, the operation proceeds to step S106.

(Step S106) The base station A1 transmits a DMRS to each of the terminal devices B1 to B4. Subsequently, the operation proceeds to step S107.

(Step S107) Based on the DMRS transmitted in step S106, each of the terminal devices B1 to B4 estimates the channel state of an equivalent channel including the nonlinear precoding performed in the base station A1. Subsequently, the operation proceeds to step S108.

(Step S108) The base station A1 transmits the data signal generated in step S105 to each of the terminal devices B1 to B4. Subsequently, the operation proceeds to step S109.

(Step S109) Each terminal device Bn detects and acquires the data signal on the basis of equivalent channel state information indicating the channel state of the equivalent channel estimated in step S107.

In the following description, the terminal devices B1 to BN (N=4 in FIGS. 1 and 2) will representatively be referred to as "terminal device Bn". The same applies to a case other than N=4. When the term "terminal device Bn" is used, the description indicates that the terminal devices B1 to BN perform the same operation. When the operation of each component is described by using a variable n, such as "receiving section 102-n", the description indicates that the same operation is performed by each receiving section 102-n, such as a receiving section 102-1, a receiving section 102-2, . . . , and a receiving section 102-N. The same technique is used for describing other components. For example, when describing the operation of an n-th component XYZ-n as a representative component, the description indicates that the same operation is performed by first to N-th components XYZ-1 to XYZ-N.

<Base Station A1>

Figure 3:
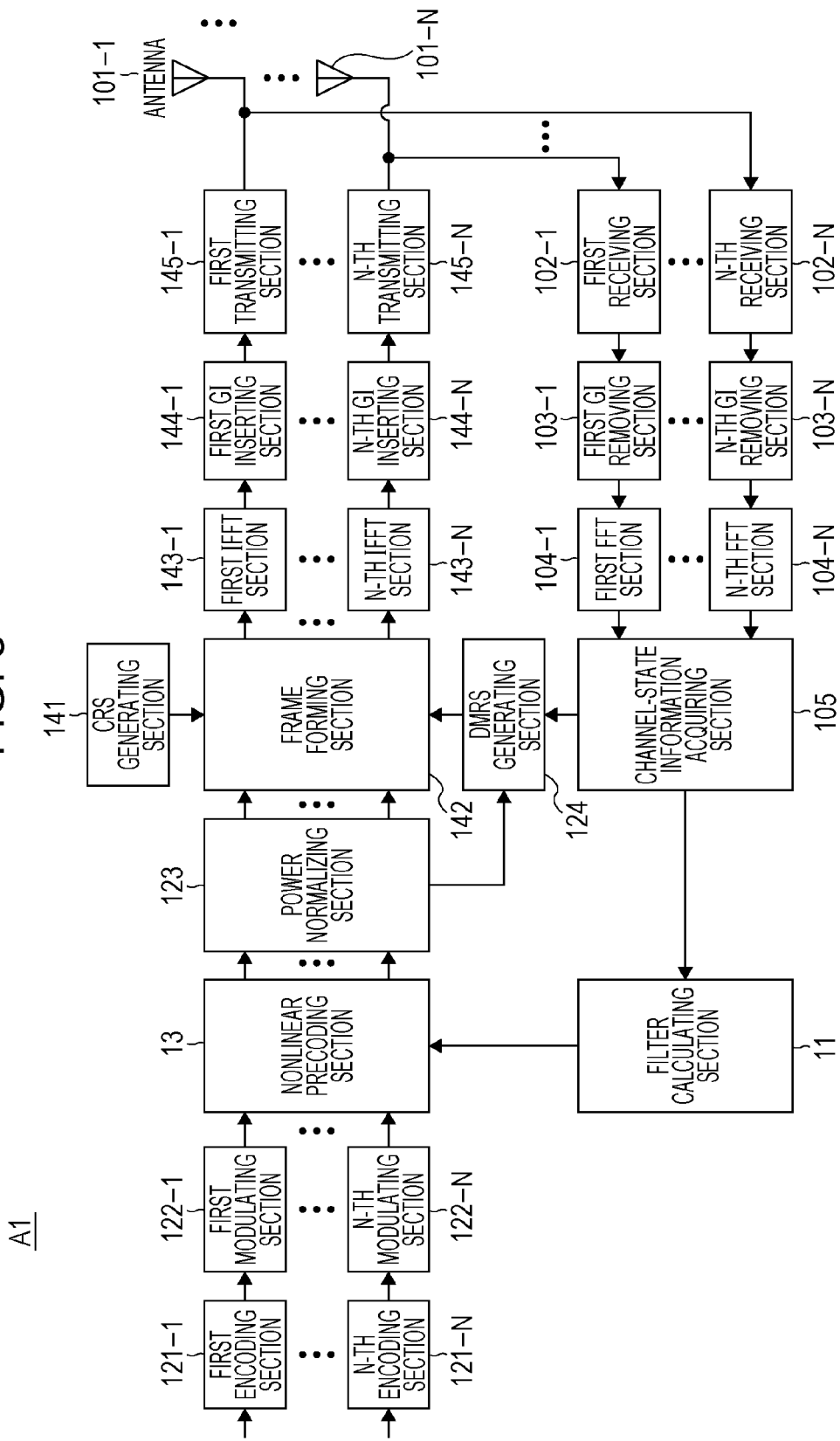
FIG. 3 is a functional block diagram illustrating one configuration example of a base station A1 according to the first embodiment.

FIG. 3 is a functional block diagram illustrating one configuration example of the base station A1 according to this embodiment. In this diagram, the base station A1 includes antennas 101-1 to 101-N, first to N-th receiving sections 102-1 to 102-N, first to N-th GI (guard interval) removing sections 103-1 to 103-N, first to N-th FFT (fast Fourier transform) sections 104-1 to 104-N, a channel-state information acquiring section 105, a filter calculating section 11, first to N-th encoding sections 121-1 to 121-N, first to N-th modulating sections 122-1 to 122-N, a power normalizing section 123, a DMRS generating section 124, a nonlinear precoding section 13, a CRS generating section 141, a frame forming section 142, first to N-th IFFT (inverse fast Fourier transform) sections 143-1 to 143-N, first to N-th GI inserting sections 144-1 to 144-N, and first to N-th transmitting sections 145-1 to 145-N.

The base station A1 in FIG. 3 is a base station that includes N antennas 101-1 to 101-N and multiplexes N terminal devices (e.g., N=4 in the example shown in FIGS. 1 and 2). Although an orthogonal frequency division multiplexing (OFDM) method, for example, is used for both uplink and downlink in the base station A1 in FIG. 3, the present invention is not limited to this method. Alternatively, a frequency division multiplexing (FDM) method may be used in place of OFDM.

The receiving section 102-n receives a signal (carrier frequency signal) transmitted from the terminal device Bn via the antenna 101-n. This signal includes channel state information. The receiving section 102-n performs down-conversion on the received signal and performs A/D (analog/digital) conversion so as to generate a baseband digital signal. The receiving section 102-n outputs the generated digital signal to the GI removing section 103-n.

The GI removing section 103-n removes GI from the digital signal input from the receiving section 102-n and outputs the signal to the FFT section 104-n after the removing process.

The FFT section 104-n performs FFT on the signal input from the GI removing section 103-n so as to generate a frequency-domain signal. The FFT section 104-n outputs the generated frequency-domain signal to the channel-state information acquiring section 105.

The channel-state information acquiring section 105 demodulates the signal input from the FFT section 104-n and extracts the channel state information from the demodulated information. The channel-state information acquiring section 105 forms a channel matrix H for each subcarrier from the channel state information. In this case, the channel state information of an $n_1$-th terminal device $Bn_1$ is expressed by an N dimensional row vector having a complex number of components. An $n_2$-th component of this row vector indicates a complex gain of a channel between an $n_2$-th antenna 101-$n_2$ of the base station and the terminal device $Bn_1$. The channel-state information acquiring section 105 generates the channel matrix H by arranging row vectors for all of the terminal devices B1 to BN in a certain order. H is a matrix having N rows by N columns, and an $n_1$-th row $n_2$-th column component indicates a complex gain of a channel between the $n_1$-th terminal device $Bn_1$ and the $n_2$-th antenna 101-$n_2$ of the base station (in this case, $n_1$ and $n_2$ are arbitrary integers ranging between 1 and N).

As will be described later, the terminal device Bn may notify the base station A1 of the row vector indicating the channel state information after performing approximation or normalization of the norm. In this case, the channel-state information acquiring section 105 generates the channel matrix H by using the row vector notified by each terminal device Bn.

The channel-state information acquiring section 105 inputs the channel matrix H generated for each subcarrier to the filter calculating section 11 and the DMRS generating section 124. Although the channel matrix H is acquired for each subcarrier as an example, channel matrices H may be acquired one by one in units of multiple predetermined successive subcarriers (subchannels).

Of the signal output from the FFT section 104-n, a signal other than the signal including the channel state information is demodulated by a controller C (not shown). Of the demodulated information, control information is used for controlling the base station A1, and data other than the control information is transmitted to other base stations, servers, and the like.

Based on the channel matrix H for each subcarrier input from the channel-state information acquiring section 105, the filter calculating section 11 calculates filters to be used for nonlinear precoding. In the filter calculating section 11, filters are calculated simultaneously for multiple subcarriers.

In this embodiment, the amount of calculation required for filter calculation is reduced by utilizing the fact that channel matrices H corresponding to adjoining frequencies are channel matrices that are correlated to each other (that are similar to each other). Specifically, information obtained in the process of calculating filters for one certain subcarrier is reutilized for another subcarrier so that the amount of calculation can be reduced as compared with a case where filters are individually calculated for all of the subcarriers. Detailed operation will be described later.

The filter calculating section 11 inputs the calculated filters corresponding to each subcarrier to the nonlinear precoding section 13.

The encoding section 121-$n$ receives information bits (data) destined for each terminal device Bn (e.g., N=4 in FIGS. 1 and 2). The encoding section 121-$n$ performs error-correction encoding on the received information bits and outputs the encoded bits to the modulating section 122-$n$ after the encoding process.

The modulating section 122-$n$ modulates the encoded bits input from the encoding section 121-$n$ so as to generate a data signal destined for the terminal device Bn. The modulating section 122-$n$ inputs the generated data signal to the nonlinear precoding section 13.

Figure 6:
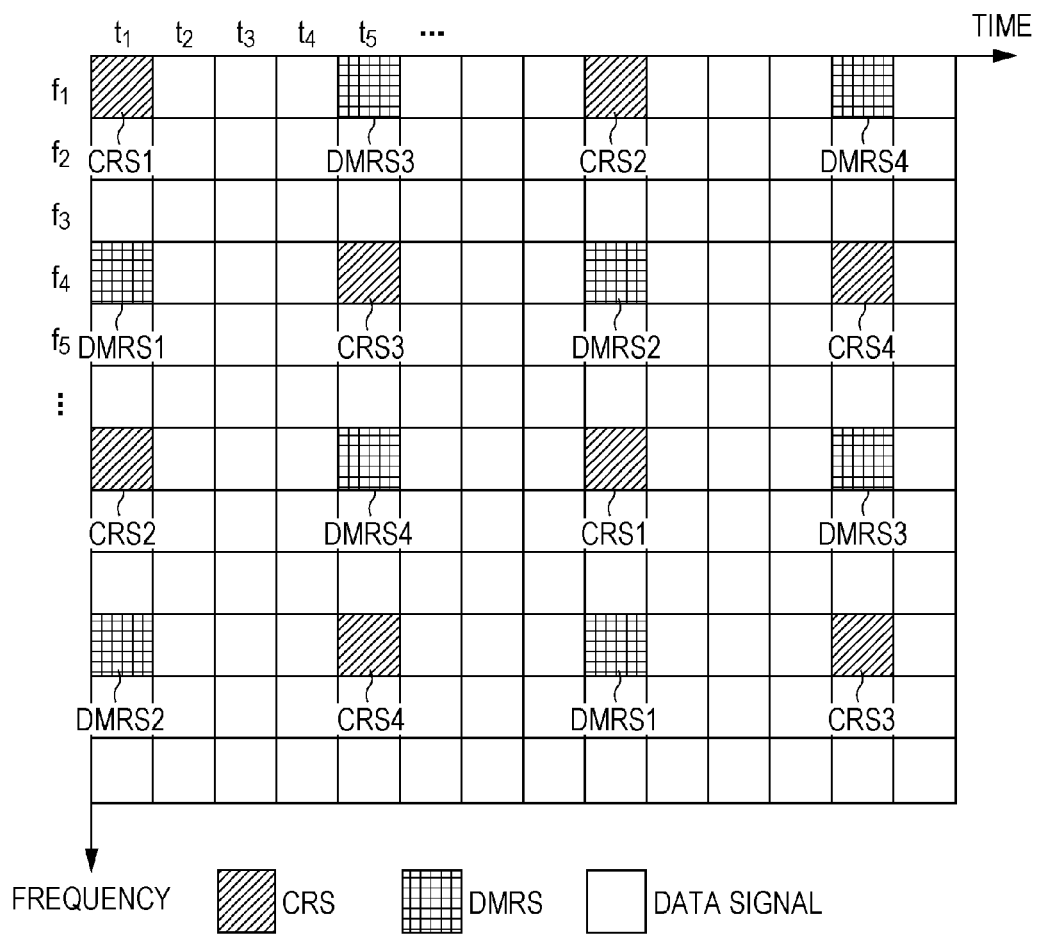
FIG. 6 schematically illustrates an example of the configuration of a frame according to this embodiment when N=4.

The nonlinear precoding section 13 divides all of the input data signals into groups each including one data signal destined for each terminal device Bn, and determines OFDM symbols and subcarriers used for transmitting the groups. For example, the OFDM symbols and the subcarriers are associated with each other in accordance with a frame format shown in FIG. 6. FIG. 6 schematically illustrates an example of the configuration of a frame according to this embodiment when N=4. This diagram illustrates the configuration of the frame when signal mapping is performed by the frame forming section 142. In FIG. 6, $t_1$, $t_2$, $t_3$, $t_4$, $t_5$, and so on denote transmission timings for the OFDM symbols, and $f_1$, $f_2$, $f_3$, $f_4$, $f_5$, and so on denote the subcarriers. Each cell (corresponding to one subcarrier in one OFDM symbol) in FIG. 6 will be referred to as "resource element". All resource elements corresponding to successive OFDM symbols in multiple successive subcarriers (e.g., all of the resource elements in FIG. 6) will be referred to as "resource block". In FIG. 6, resource elements indicated by white (void) cells correspond to resource elements that transmit data signals, whereas the remaining resource elements correspond to resource elements that transmit CRSs and DMRSs. Furthermore, in FIG. 6, the vertical direction (frequency-axis direction) denotes the subcarriers, whereas the horizontal direction (time-axis direction) denotes the OFDM symbols.

The nonlinear precoding section 13 determines which of the resource elements are to transmit the data signals of the groups in accordance with the frame format shown in FIG. 6. Subsequently, based on the subcarriers corresponding to the resource elements that are to transmit the groups, nonlinear precoding is performed on these groups. The nonlinear precoding section 13 sets a data signal of each terminal device Bn in a certain group as $s_n$, sets a column vector having all of $s_1$ to $s_N$ as components as s, and performs nonlinear precoding on the data signal s by using the filters input from the filter calculating section 11. When nonlinear precoding is performed on each group, an N dimensional column vector x expressing a transmission signal is obtained. An n-th component (n=1, 2, . . . , N) of x indicates a signal to be transmitted by the antenna 101-$n$ (n=1, 2, . . . , N). The nonlinear precoding section 13 inputs the signal x to the power normalizing section 123.

The power normalizing section 123 calculates a power normalization coefficient β on the basis of the input nonlinear-precoded data signal x. In order to make the transmission power constant, the base station A1 normalizes the total transmission power of data signals within a certain number of subcarriers and a certain number of OFDM symbols (referred to as "power normalization unit"). A power normalization unit indicates, for example, the entire frame unit shown in FIG. 6. First, the power normalizing section 123 calculates a total sum $P_x$ of the power of the signal x calculated by the nonlinear precoding section 13 in the power normalization unit. In this case, the signal x only expresses a data signal and does not include DMRS and CRS. The power normalizing section 123 calculates the power normalization coefficient β with the following expression, assuming that the total power that can be allocated by the base station A1 to the data-signal transmission in a single power normalization unit is defined as $P_{tr}$.

[Expression 1]

$$\beta = (P_{tr}/P_x)^{1/2} \qquad (1\text{-}1)$$

The power normalizing section 123 performs power normalization on the data signal by multiplying the calculated power normalization coefficient β by the data signal, and inputs the data signal to the frame forming section 142 after the power normalization. Moreover, the power normalizing section 123 inputs the power normalization coefficient β to the DMRS generating section 124.

The DMRS generating section 124 generates a DMRS destined for each terminal device Bn. A DMRS generating method will be described later.

The CRS generating section 141 generates a CRS having signal points (reference signals) known in the base station A1 and the terminal device Bn, and outputs the generated CRS to the frame forming section 142.

The frame forming section 142 maps the data signal input from the power normalizing section 123, the DMRS input from the DMRS generating section 124, and the CRS input from the CRS generating section 141. In this case, the frame forming section 142 maps the signals in temporal units preliminarily set for each antenna 101-$n$, that is, on a frame-by-frame basis for each antenna 101-$n$. The frame forming section 142 may map the data signal, the DMRS, and the CRS in different frames or in the same frame. For example, the CRS alone may be mapped in a certain frame, and the DMRS and the data signal may be mapped in another frame. In this case, it is assumed that the base station A1 maps the CRS, the DMRS, and the data signal in a frame or frames in accordance with a predetermined mapping technique, and the aforementioned map is ascertained in advance by the terminal device Bn.

An example of a predetermined map will now be described with reference to FIG. 6. In FIG. 6, the CRSs, the DMRSs, and the data signals are arranged in different resource elements by the frame forming section 142 and are transmitted by the base station A1 via the antennas 101-$n$ (n=1 to 4 in FIG. 6). For example, the CRS (referred to as "CRS1") to be transmitted via the antenna 101-1 is transmitted at a time point $t_1$ and with a frequency $f_1$, and the CRS (referred to as "CRS3") to be transmitted via the antenna 101-3 is transmitted at a time point $t_5$ and with a frequency $f_4$. The CRS (referred to as "CRS2") to be transmitted via another antenna 101-2 and the CRS (referred to as "CRS4") to be transmitted via another antenna 101-4 are similarly transmitted in accordance with the example of the frame configuration shown in FIG. 6.

Furthermore, FIG. 6 illustrates a state where the DMRSs destined for the respective terminal devices are arranged in different resource elements and are transmitted from the base station A1. For example, the DMRS (referred to as "DMRS1") destined for the terminal device B1 is transmitted at a time point $t_1$ and with a frequency $f_4$, and the DMRS (referred to as "DMRS3") destined for the terminal device B3 is transmitted at a time point $t_5$ and with a frequency $f_1$. The DMRS (referred to as "DMRS2") destined for another terminal device B2 and the DMRS (referred to as "DMRS4") destined for another terminal device B4 are similarly transmitted in accordance with the example of the frame configuration shown in FIG. 6.

Furthermore, in FIG. 6, the frame forming section 142 transmits a nonlinear-precoded data signal from each resource element indicating a data signal in FIG. 6. Specifically, all of the data signals are transmitted to the terminal devices B1 to BN at the same time and with the same frequency.

The frame forming section 142 may dispose another signal (e.g., a control signal) in a resource element different from those of the CRSs, DMRSs, and the data signals. In this case, it is assumed that the location where the control signal is disposed is ascertained in advance by the base station A1 and the terminal device Bn.

The frame forming section 142 outputs the mapped signals to be transmitted via the antenna 101-$n$ to the IFFT section 143-$n$ on a frame-by-frame basis (the same processing is performed for n=1, 2, ..., N).

The IFFT section 143-$n$ performs IFFT on the signal input from the frame forming section 142 so as to generate a time-domain signal. In this case, the IFFT section 143-$n$ performs the IFFT on a frame-by-frame basis. The IFFT section 143-$n$ outputs the generated time-domain signal to the GI inserting section 144-$n$.

The GI inserting section 144-$n$ adds a guard interval to the signal input from the IFFT section 143-$n$ and outputs the signal to the transmitting section 145-$n$ after the adding process.

The transmitting section 145-$n$ performs D/A (digital/analog) conversion on the signal (i.e., baseband digital signal) input from the GI inserting section 144-$n$. The transmitting section 145-$n$ performs up-conversion on the converted signal so as to generate a carrier frequency signal. The transmitting section 145-$n$ transmits the generated signal via the antenna 101-$n$.

<Terminal Device Bn>

Figure 15:
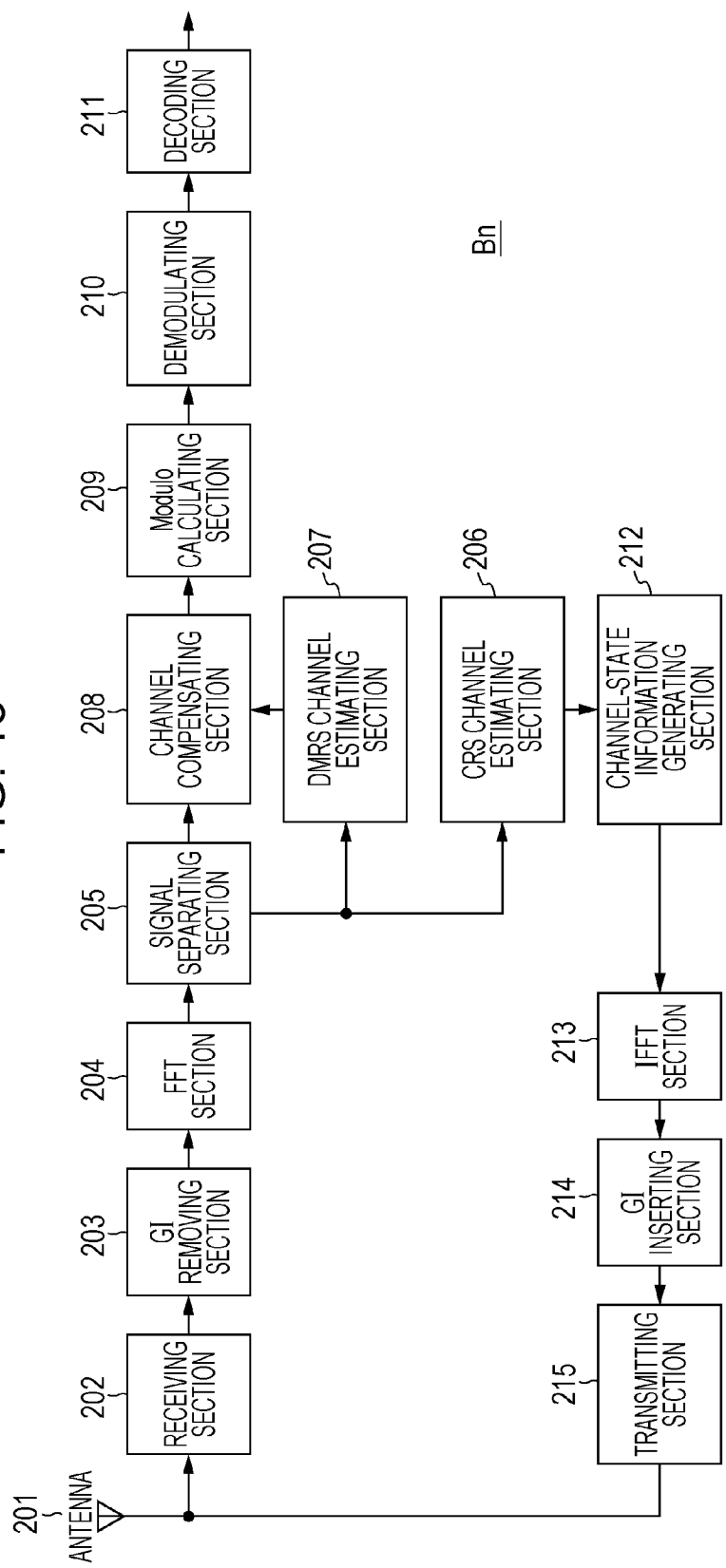
FIG. 15 is a functional block diagram illustrating one configuration example of each terminal device Bn according to the first embodiment.

FIG. 15 is a functional block diagram illustrating one configuration example of the terminal device Bn according to this embodiment. In FIG. 15, the terminal device Bn includes an antenna 201, a receiving section 202, a GI removing section 203, an FFT section 204, a signal separating section 205, a CRS channel estimating section 206, a DMRS channel estimating section 207, a channel compensating section 208, a modulo calculating section 209, a demodulating section 210, a decoding section 211, a channel-state information generating section 212, an IFFT section 213, a GI inserting section 214, and a transmitting section 215.

The receiving section 202 receives, via the antenna 201, a signal (i.e., a carrier frequency signal) transmitted from the base station A1. The receiving section 202 performs down-conversion on the received signal and performs A/D (analog/digital) conversion so as to generate a baseband digital signal. The receiving section 202 outputs the generated digital signal to the GI removing section 203.

The GI removing section 203 removes GI from the digital signal input from the receiving section 202 and outputs the signal to the FFT section 204 after the removing process.

The FFT section 204 performs FFT on the signal input from the GI removing section 203 so as to generate a frequency-domain signal. The FFT section 204 outputs the generated frequency-domain signal to the signal separating section 205.

The signal separating section 205 separates the signal input from the FFT section 204 on the basis of mapping information notified from the base station A1. Of the separated signals, the signal separating section 205 outputs the CRS to the CRS channel estimating section 206 and the DMRS to the DMRS channel estimating section 207. The signal separating section 205 outputs a signal (e.g., the data signal) other than the CRS and the DMRS to the channel compensating section 208.

The CRS channel estimating section 206 estimates a channel state on the basis of the CRS input from the signal separating section 205 and outputs information indicating the estimated channel state to the channel-state information generating section 212.

The channel-state information generating section 212 generates channel state information on the basis of the channel state input from the CRS channel estimating section 206 (this process will be referred to as "channel state information generating process"). In this case, the channel state information is a row vector having a complex gain of a channel between the antenna 201 of the terminal device Bn and the corresponding antenna 101-$n$ of the base station A1 as each component. This row vector can be expressed by the following expression.

[Expression 2]

$$h_n = [h_{n1}, h_{n2}, \ldots, h_{nN}] \quad (1\text{-}2)$$

The channel-state information generating section 212 may notify the base station A1 of this row vector $h_n$ as the channel state information or may notify the base station A1 of the following expression, in which the norm of Expression (1-2) is normalized to a value $C_n$, as the channel state information.

[Expression 3]

$$h_{norm\text{-}n} = C_n / |h_n| \times [h_{n1}, h_{n2}, \ldots, h_{nN}] \quad (1\text{-}3)$$

The value $C_n$ may be, for example, a square root of an average reception power of the entire communication band (i.e., an average reception power obtained from path-loss and shadowing and from which the effect of phasing is eliminated), or may be another value. Furthermore, a value obtained by quantizing or approximating the row vector expressed by Expression (1-2) or Expression (1-3) may be notified as the channel state information.

In the channel-state information acquiring section 105 of the base station A1, a value obtained by quantizing or approximating Expression (1-2) in correspondence with the channel-state information generating section 212 may be used as the row vector constituting each row of the channel matrix H. Moreover, Expression (1-3) that is normalized, or a value obtained by quantizing or approximating Expression (1-3) may be used.

The channel-state information generating section 212 modulates the generated channel state information and outputs the signal of the modulated channel state information to the IFFT section 213.

The IFFT section 213 performs IFFT on the signal input from the channel-state information generating section 212 so as to generate a time-domain signal. The IFFT section 213 outputs the generated time-domain signal to the GI inserting section 214.

The GI inserting section 214 adds a guard interval to the signal input from the IFFT section 213 and outputs the signal to the transmitting section 215 after the adding process.

The transmitting section 215 performs D/A (digital/analog) conversion on the signal (i.e., baseband digital signal) input from the GI inserting section 214. The transmitting section 215 performs up-conversion on the converted signal so as to generate a carrier frequency signal. The transmitting section 215 transmits the generated signal via the antenna 201.

The DMRS channel estimating section 207 estimates the channel state of an equivalent channel that regards nonlinear precoding processing as a part of the channel on the basis of the DMRS input from the signal separating section 205. It is assumed that the channel state of the terminal device Bn during transmission of the DMRS and the data signal is defined as $h_d$, and the channel state indicated by the channel state information generated by the channel-state information generating section 212 is defined as $h_{fd}$.

The nonlinear precoding processing performed in the nonlinear precoding section 13 is equivalent to multiplication of a filter W ($=H^{-1}$) by a modulation signal s, except for the addition of a perturbation vector. However, because the filter W is calculated at the filter calculating section 11 on the basis of a channel state vector fed back by the terminal device Bn instead of $h_d$, the following expression is obtained as an equivalent channel $h_{eq\_n}$ (one-dimensional complex number) by the terminal device Bn.

[Expression 4]

$$h_{eq\_n} = \beta q h_d w_n / q = \beta h_d w_n \quad (1\text{-}4)$$

In this case, $w_n$ denotes an n-th column of the filter W. Moreover, q denotes a signal transmitted as a DMRS and is known in the terminal device Bn. The DMRS and a data signal disposed at a location corresponding to a predetermined frequency and a predetermined time point (e.g., within the same resource block) travel through an equivalent channel that is substantially the same as $h_{eq\_n}$ so as to be received by the terminal device Bn.

The DMRS channel estimating section 207 outputs equivalent channel state information indicating the estimated channel state of the equivalent channel $h_{eq\_n}$ to the channel compensating section 208.

The channel compensating section 208 performs channel compensation on the signal input from the signal separating section 205 by using the equivalent channel state information input from the DMRS channel estimating section 207. Specifically, assuming that the data signal is defined as y, a data signal $y_{cc}$ after the channel compensation process is as follows: $y_{cc} = y/h_{eq\_n}$. The channel compensating section 208 outputs the signal $y_{cc}$ obtained after the channel compensation process to the modulo calculating section 209.

The modulo calculating section 209 performs modulo calculation on the data signal $y_{cc}$ input from the channel compensating section 208. The modulo calculation is expressed by the following expression.

[Expression 5]

$$\mathrm{mod}(\alpha) = \alpha - \mathrm{floor}((Re(\alpha)+\tau/2)/\tau)*\tau - j*\mathrm{floor}((Im(\alpha)+\tau/2)/\tau)*\tau \quad (1\text{-}5)$$

In this case, j denotes an imaginary unit, and floor($\gamma$) denotes a maximum integer that does not exceed $\gamma$. Furthermore, Re($\alpha$) and Im($\alpha$) denote a real part and an imaginary part, respectively, of a complex number $\alpha$. When the average power of a modulation signal is normalized to 1, $\tau$ becomes a predetermined value known in advance at the transmission and reception sides in accordance with the modulation method. For example, in QPSK (quadrature phase shift keying), $\tau=2\sqrt{2}$. In 16QAM (quadrature amplitude modulation), $\tau=8\sqrt{10}$. In 64QAM, $\tau=16\sqrt{42}$. However, if $\tau$ is the same between the base station and each terminal device, a value different from these values may be used. The modulo calculating section 209 outputs a signal mod($y_{cc}$) to the demodulating section 210 after the modulo calculation process.

The demodulating section 210 demodulates the signal input from the modulo calculating section 209. The demodulating section 210 outputs demodulated information (i.e., hard-decided encoded bits or a soft-estimated value of encoded bits) to the decoding section 211.

The decoding section 211 decodes the information input from the demodulating section 210 so as to acquire information bits, and outputs the acquired information bits.

<Main Part of this Embodiment: Description of Filter Calculating Section 11>

Next, the operation of the filter calculating section 11, which is the main part of this embodiment, will be described in detail in comparison with a related-art example. This embodiment is considered as one example of LR-THP in DL MU-MIMO.

In LR-THP, LR is first performed on a channel matrix H so as to convert it into an equivalent channel matrix G having high orthogonality. With the conversion into a channel with high orthogonality, the power of MUI to be removed can be suppressed. After suppressing MUI, THP, which is a sequential interference removal method, is performed on the equivalent channel G. With LR-THP, a signal destined for each terminal device can be transmitted with higher power efficiency as compared with normal THP in which sequential interference removal is directly performed on the channel matrix H.

However, LR-THP is problematic in that it requires a large amount of calculation. In LR-THP, the channel matrix H is converted into an equivalent channel matrix G by LR so that filters required for the sequential interference removal in THP are calculated. In this case, a large amount of calculation is required especially for LR.

LR is divided into two kinds of processing, namely, (1) triangulation processing in which the channel matrix H is divided into products of a unitary matrix and a triangular matrix and (2) quasi-orthogonalization processing in which a unimodular matrix is generated from the triangular matrix. The term "unimodular matrix" refers to a matrix in which each component is a Gaussian integer (i.e., the solid part and the imaginary part are both a complex number of an integer) and an absolute value of the matrix is 1.

Known examples of methods for reducing the amount of calculation in LR include a method of reducing the amount of calculation required in a single LR process, as in Non Patent Literature 4 and Non Patent Literature 5, and a method of reducing the amount of calculation by utilizing the similarities between input values of LR performed multiple times, as in Non Patent Literature 6. Either method corresponds to an algorithm that reduces the quasi-orthogonalization processing (2) but does not correspond to an algorithm that reduces the triangulation processing of the channel matrix. The number of calculation processes required for triangulation processing is proportional to the cube of the number of terminal devices subject to spatial multiplexing. The amount of calculation required in LLLA is more than or equal to the biquadrate of the number of terminal devices subject to spatial multiplexing with respect to quasi-orthogonalization. In LLLA in the related art, the time required for quasi-orthogonalization processing is dominant over that for triangulation processing. Therefore, methods of reducing the amount of calculation in quasi-orthogonalization processing have been proposed.

However, by performing LR using JQO discussed in Non Patent Literature 3, the number of calculation processes for quasi-orthogonalization becomes proportional to the square of the number of terminal devices subject to spatial multiplexing. Furthermore, by using the technology according to Non Patent Literature 5, the number of calculation processes required for quasi-orthogonalization can be greatly reduced. With the reduction in the amount of calculation for the part of quasi-orthogonalization, the amount of calculation required for triangulation performed prior to quasi-orthogonalization occupies the larger percentage of the overall LR algorithm.

Figures 13, 14:
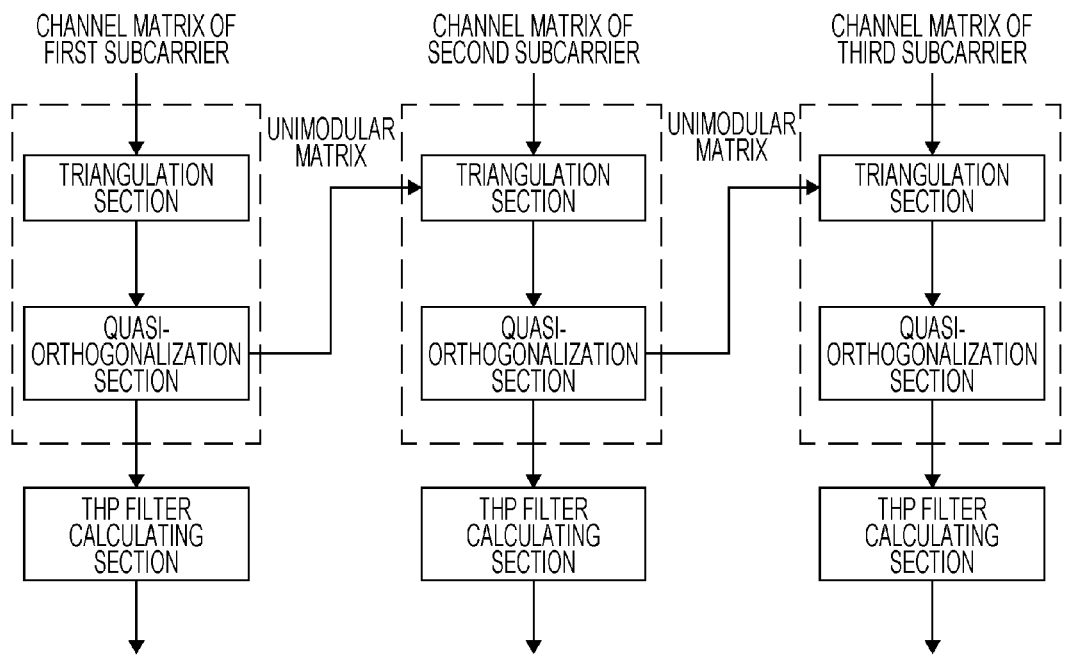
FIG. 13 illustrates the operation of the THP filter calculating section 113-1.
FIG. 14 is a diagram in which the amount of calculation for quasi-orthogonalization is reduced by using a unimodular matrix U (i.e., a matrix for converting a channel matrix H into an equivalent channel matrix G having high orthogonality), which is obtained by performing LR (LLL-algorithm in this case) on a channel matrix H related to a first subcarrier, for generating an input value of LR processing in an adjoining second subcarrier.

Furthermore, even when ALLL discussed in Non Patent Literature 6 is applied to LR-THP, the amount of calculation required for triangulation processing cannot be reduced. With regard to the configuration of the filter calculating section 11, the configuration shown in FIG. 14 is conceivable. The amount of calculation for quasi-orthogonalization is reduced by using a unimodular matrix U (i.e., a matrix for converting a channel matrix H into an equivalent channel matrix G having high orthogonality), which is obtained by performing LR (LLL-algorithm in this case) on a channel matrix H related to a first subcarrier, for generating an input value of LR processing in an adjoining second subcarrier. Therefore, it is apparent from FIG. 14 that each subcarrier still requires a single triangulation section. Accordingly, even when the ALLL method is used, triangulation processing is still necessary. Thus, the number of calculation processes for triangulation processing, which requires a certain amount of calculation regardless of an input value, cannot be reduced.

Figures 22, 23, 24:
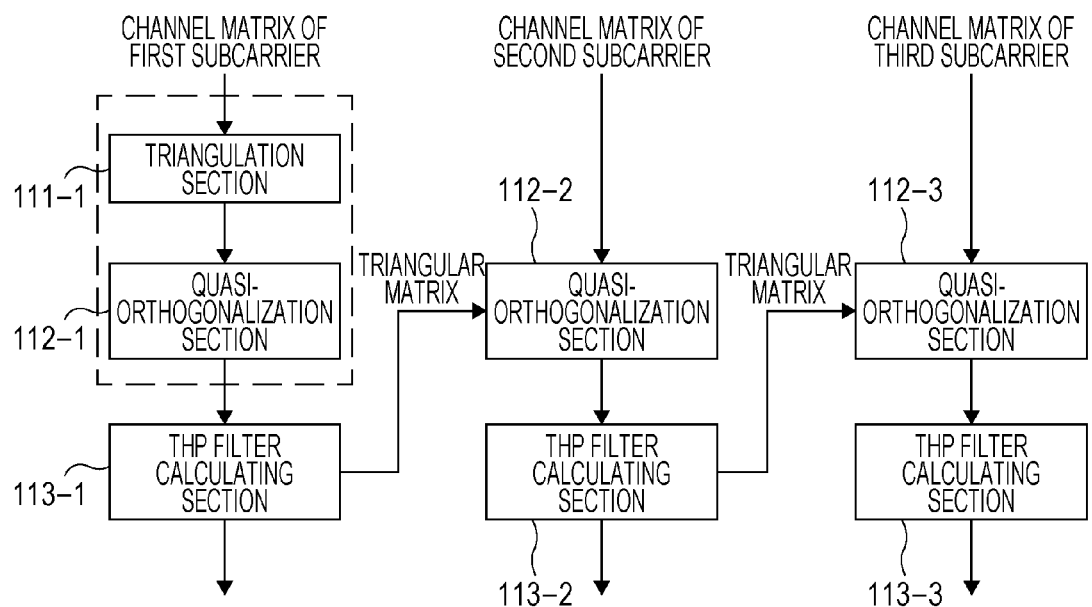
FIG. 22 illustrates detailed operation of a DFE filter calculating section 413-1.
FIG. 23 illustrates detailed operation of an LR-DFE section.
FIG. 24 schematically illustrates the filter calculating section 11 according to this embodiment as a comparison to FIG. 14.

FIG. 24 schematically illustrates the filter calculating section 11 according to this embodiment as a comparison to FIG. 14. In FIG. 24, second and third subcarriers have no triangulation sections, and a triangular matrix is input to a quasi-orthogonalization section 112-2 of the adjoining second subcarrier from a THP filter calculating section 113-1 of the first subcarrier. In FIG. 24, the triangular matrix calculated at the THP filter calculating section 113-1 is utilized at the adjoining subcarrier so that the second subcarrier is provided with a configuration part similar to a triangulation section 111-1. Thus, quasi-orthogonalization of a channel matrix of the second subcarrier is performed without having to perform triangulation therein. In the third subcarrier, a triangular matrix calculated at a THP filter calculating section 113-2 is similarly utilized so that quasi-orthogonalization can be performed in the third subcarrier without having to provide the third subcarrier with a triangulation section.

As discussed in Non Patent Literature 5, in order to generate an equivalent channel with higher orthogonality, it is preferable that triangulation processing in LR processing be performed while setting the columns of $H_H$ in a certain order such that diagonal components of a triangular matrix to be calculated are arranged with the norm thereof tending to decrease toward the upper left side.

Furthermore, each THP filter calculating section performs processing for calculating a triangular matrix for calculating MUI while setting the columns of an equivalent channel matrix $G^H$ in a certain order. In this case, the triangular matrix is generated such that diagonal components of the triangular matrix are arranged with the norm thereof tending to decrease toward the upper left side. The reason for this is as follows. Since a higher diversity order can be obtained for components located toward the upper left side, the overall power efficiency can be increased by giving the highest diversity order to a stream with a low gain.

Specifically, the triangulation ordering standards for LR and THP have different purposes but are the same. In this embodiment, by utilizing this common point, the triangular matrix generated when calculating the THP filter is used at the quasi-orthogonalization section 112-2 in the adjoining second subcarrier.

Although the triangular matrix calculated at the THP filter calculating section 113-1 of the adjoining first subcarrier is not an optimal one for the second subcarrier, quasi-orthogonalization can be sufficiently performed even with the triangular matrix calculated from the first subcarrier in view of the fact that the channel matrices of the first subcarrier and the second subcarrier are correlated to each other (i.e., are similar to each other).

In the triangular matrix calculated at the THP filter calculating section 113-1, diagonal components are arranged such that the norm thereof tends to decrease toward the upper left side. Furthermore, in the triangular matrix required at the quasi-orthogonalization section 112-2, diagonal components are arranged such that the norm thereof tends to decrease toward the upper left side.

Likewise, the triangular matrix calculated at the THP filter calculating section 113-2 of the second subcarrier is used at the third subcarrier, whereby the third subcarrier does not need to be provided with a triangulation section. Similarly, in each subcarrier, a triangular matrix generated when calculating a THP filter of an adjoining subcarrier is sequentially utilized for quasi-orthogonalization so that the amount of calculation can be reduced.

With regard to the processing in each of the quasi-orthogonalization section 112-1 and the quasi-orthogonalization section 112-2, the amount of calculation required when using JQO is equal to the square of the number N of terminal devices to be multiplexed, whereas the amount of calculation required in a THP filter calculating section and a triangulation section is equal to the cube thereof. Therefore, by reducing the number of triangulation sections, the amount of calculation can be greatly reduced.

The operation of the filter calculating section 11, which is the characteristic part of this embodiment, has been schematically described above.

Next, the operation of specific components in the filter calculating section 11 (i.e., the operation of a first filter calculating section 110-1 and the operation of connection filter calculating sections 110-2 to $N_{sc}$) will be described with reference to FIG. 7.

First, the first filter calculating section 110-1 will be described.

The triangulation section 111-1 and the THP filter calculating section 113-1 within the first filter calculating section 110-1 acquire a channel matrix H of the first subcarrier.

The triangulation section 111-1 performs sorted QR decomposition (SQRD) shown in FIG. 11 by using the channel matrix H. (Since the operation of the first filter calculating section 110-1 includes elements similar to those in the operation of each of the connection filter calculating sections 110-2 to $N_{sc}$, the suffix indicating a subcarrier number, which will be described later, for each variable (such as H, G, Q, and R) will be omitted).

The procedure of SQRD shown in FIG. 11 will now be described.

Zero-th line: a Hermitian conjugate $H^H$ of the channel matrix is acquired as an input. In this case, "$^H$" denotes a Hermitian conjugate. Although it is described above that the triangulation section 111-1 acquires the channel matrix H, H may be acquired as an input and be subsequently converted into a Hermitian conjugate $H^H$, or may be converted into a Hermitian conjugate $H^H$ in advance before it is input.

First line: N×N matrices $R_I$ (=0) and $Q_I$ (=$H^H$) are defined. In this case, "0" indicates a zero matrix in which all components are zero. Moreover, S is defined as an N dimensional row vector [1, 2, . . . , N].

Second line: the third to twelfth lines are repeated for i=1 to N.

Third line: the number of a column with the smallest norm in $Q_I$ is set as $k_i$.

In a matrix X, X(p, q) denotes a p-th row q-th column component in the matrix X, X(:, m) denotes an m-th column in the matrix X, and X(m, :) denotes an m-th row in the matrix X. Furthermore, X(p:q, m) denotes a column vector expressed by a (p, m) component to a (q, m) component in the matrix X, X(m, p:q) denotes a row vector expressed by a (m, p) component to a (m, q) component in the matrix X, and $X(p_1:q_1, p_2:q_2)$ denotes a matrix expressed by a $p_1$-th column to a $q_1$-th column and a $p_2$-th column to a $q_2$-th column in the matrix X.

Fourth line: a $k_i$-th column and an i-th column of $Q_I$ are switched.

Fifth line: a $k_i$-th column and an i-th column of $R_I$ are switched.

Sixth line: a $k_i$-th component and an i-th component of S are switched.

Seventh line: the norm (the length of a vector Q(:, i)) of $Q_I$(:, i) is substituted into an i-th row i-th column component of $R_I$.

Eighth line: $Q_I$(:, i)/$R_I$(i, i) is substituted into $Q_I$(:, i).

Ninth line: the tenth and eleventh lines are repeated for m=(i+1) to N.

Tenth line: $Q_I$(:, i)$^H Q_I$(:, m) is substituted into $R_I$(i, m).

Eleventh line: $Q_I$(:, m)−$R_I$(i, m)$Q_I$(:, i) is substituted into $Q_I$(:, m).

Twelfth line: the tenth and eleventh lines are repeated for m=(i+1) to N.

Thirteenth line: the third to twelfth lines are repeated for i=1 to N.

Fourteenth line: "$I_N$" is set as a unit matrix of N rows by N columns, and a matrix obtained by rearranging the columns of $I_N$ in the order of row vectors S is set as $\Pi_I$.

Fifteenth line: the matrices $R_I$ and $\Pi_I$ are output.

The triangulation section 111-1 calculates a unitary matrix $Q_I$, a triangular matrix $R_I$, and a permutation matrix $\Pi_I$ obtained by performing sorted QR decomposition, and inputs $R_I$ and $\Pi_I$ to the quasi-orthogonalization section 112-1.

The quasi-orthogonalization section 112-1 performs quasi-orthogonalization processing shown in FIG. 12 by using the triangular matrix $R_I$ and the permutation matrix $\Pi_I$ so as to calculate a unimodular matrix U.

The procedure shown in FIG. 12 will now be described.

Zero-th line: the matrices $R_I$ and $\Pi_I$ are acquired as inputs.

First line: N×N matrices $M_I$(=$I_N$) and $R_L$(=$R_I$) are defined.

Second line: the third to seventh lines are repeated for k=2 to N.

Third line: the fourth to sixth lines are repeated for i=(k−1) to 1. In other words, the value of i is decremented by one from (k−1) every time the processing of each loop is performed.

Fourth line: "$R_L$(i, k)/$R_L$(i, i)" is substituted into a Gaussian integer μ. In this case, "x" is a function similar to the closest integer individually for the values of the solid part and the imaginary part of a complex number x. For example, 2.1−3.6j=2−4j.

Fifth line: $R_L$(1:i, k)−μ$R_L$(1:i, i) is substituted into $R_L$(1:i, k).

Sixth line: M(:, k)−μM(:, i) is substituted into M(:, k).

Seventh line: the fourth to sixth lines are repeated for i=(k−1) to 1.

Eighth line: the third to seventh lines are repeated for k=2 to N.

Ninth line: a matrix U (=$\Pi_I$M) is defined.

Tenth line: the matrix U is output.

This calculation performed by the triangulation section 111-1 and the quasi-orthogonalization section 112-1 for calculating the unimodular matrix U corresponds to LR processing. As compared with the channel matrix H, an equivalent channel G (having the relationship $H^H U = G^H$, that is, G=$U^H$H) having high orthogonality and from which MUI is readily removable is generated.

Subsequently, the quasi-orthogonalization section 112-1 inputs the unimodular matrix U to the THP filter calculating section 113-1.

The THP filter calculating section 113-1 calculates an equivalent channel matrix G having high orthogonality from the channel matrix H and the unimodular matrix U, and performs processing on G for calculating filters to be used for THP.

The operation of the THP filter calculating section 113-1 is shown in FIG. 13.

The procedure shown in FIG. 13 will now be described.

Zero-th line: the matrices H and U are acquired as inputs.

First line: an N×N matrix G is defined, and $G^H = H^H U$ is set.

Second line: SQRD is performed on $G^H$. SQRD is exactly the same as the processing performed by the triangulation section 111-1 shown in FIG. 11. In this case, $G^H$ is input in place of $H^H$. In FIG. 11, $H^H$ is input and $Q_I$, $R_I$, and $\Pi_I$ are output, whereas in the second line of FIG. 13, $G^H$ is input and $Q_T$, $R_T$, and $\Pi_T$ are output.

Third line: a diagonal matrix A in which only diagonal components of $R_T$ are extracted while other non-diagonal components are set to zero is defined. In this case, diag(X) denotes a diagonal matrix whose diagonal components alone are equal to those in the matrix X while non-diagonal components are all zero.

Fourth line: a matrix P (=$Q_T A^{-1}$) is defined.

Fifth line: a matrix F (=$R_T A^{-1} - I_N$) is defined.

Sixth line: a matrix T (=U$\Pi_T$) is defined.

Seventh line: P, F, T, and $R_T$ are output.

Based on the procedure shown in FIG. 13, an MUI-calculation "feedback filter" F, a "feed-forward filter" P to be multiplied last for calculating a signal to be transmitted via each antenna, a "conversion matrix" T, and a "THP triangular matrix" $R_T$ to be calculated in a filter calculating process are calculated.

Subsequently, the various filters P, F, T, $R_T$, and $\Pi_T$ calculated at the first filter calculating section 110-1 are given suffixes "$_1$" so as to be expressed as $P_1$, $F_1$, $T_1$, $R_{T1}$, and $\Pi_{T1}$. Filters to be calculated at each connection filter calculating section 110-m (m=2, 3, . . . , $N_{sc}$) are each given a suffix "$_m$". The channel H and the equivalent channel G of each subcarrier m are expressed as $H_m$ and $G_m$.

The conversion matrix $T_1$ is expressed by a product of a "unimodular matrix" $U_1$ used for performing quasi-orthogonalization on the channel matrix and a "permutation matrix" $\Pi_{T1}$ indicating the optimal interference removal order when applying THP to the channel matrix after the quasi-orthogonalization.

The THP filter calculating section 113-1 inputs the feedback filter $F_1$, the feed-forward filter $P_1$, and the conversion matrix $T_1$ to the nonlinear precoding section 13. Furthermore, the THP filter calculating section 113-1 inputs the THP triangular matrix $R_{T1}$ and the conversion matrix $T_1$ to the quasi-orthogonalization section 112-2 within the connection filter calculating section 110-2 corresponding to the second subcarrier.

Next, the operation of the connection filter calculating section 110-2 will be described. The quasi-orthogonalization section 112-2 performs quasi-orthogonalization processing (FIG. 12) on the "THP triangular matrix" $R_{T1}$ and the "conversion matrix" $T_1$ input from the THP filter calculating section 113-1 so as to calculate a unimodular matrix $U_2$, and inputs it to the THP filter calculating section 113-2. Accordingly, the unimodular matrix $U_2$ corresponding to the second subcarrier can be calculated without having to perform triangulation. The reason why triangulation processing can be omitted for the second subcarrier and onward in this embodiment is as follows. Specifically, in place of the triangulation processing in the triangulation section 111-1 of the first subcarrier, the SQRD result obtained by the THP filter calculating section in one previous subcarrier can be utilized.

The THP filter calculating section 113-2 performs the THP filter calculation processing in FIG. 13 by using the channel matrix $H_2$ of the second subcarrier and the unimodular matrix $U_2$ input from the quasi-orthogonalization section 112-2. Unlike the first filter calculating section 110-1, the connection filter calculating section 110-2 does not need to perform triangulation processing having a large amount of calculation, whereby the amount of calculation can be greatly reduced.

Moreover, the unimodular matrix $U_2$ is not calculated from the channel matrix of the second subcarrier, but is calculated by using the "THP triangular matrix" $R_{T1}$ and the "conversion matrix" $T_1$ input from the first subcarrier. In other words, the unimodular matrix U used in the THP filter calculating section 113-2 does not contain any information about the channel matrix $H_2$ of the second subcarrier. However, the unimodular matrix $U_2$ used in the THP filter calculating section 113-2 is information obtained from the first filter calculating section 110-1 corresponding to the adjoining first subcarrier, and the propagation states of the first subcarrier and the second subcarrier are highly correlated to each other. Therefore, even with this unimodular matrix $U_2$, quasi-orthogonalization can be sufficiently performed on the channel matrix $H_2$ of the second subcarrier.

As described above, even in each of the connection filter calculating sections 110-3, 110-4, . . . , and 110-$N_{sc}$, filters to be used for LR-THP are calculated by using a "THP triangular matrix" $R_{T(m-1)}$ and a "conversion matrix" $T_{(m-1)}$ obtained at the THP filter calculating section within one previous connection filter calculating section.

The filter calculating section 11 inputs the filters $P_m$, $F_m$, and $T_m$, (m=1, 2, . . . , $N_{sc}$) corresponding to each subcarrier to the nonlinear precoding section 13.

Although each kind of filter is calculated above by using the channel matrix H of each subcarrier, this corresponds to a zero forcing (ZF) principle for completely removing MUI. As an alternative to the ZF principle, filters based on a minimum mean square error (MMSE) principle in which the mean square error is minimalized may be used. Specifically, the channel matrix H is replaced with an N×2N matrix with $H_{ex}$=[H αI], and processing is performed in the filter calculating section 11. In this case, I denotes an N×N unit matrix, α denotes the square root of a value $α^2$ obtained by dividing "total noise power in all terminal devices per one subcarrier of one OFDM symbol" by "total transmission-signal power per one subcarrier of one OFDM symbol".

Even if the channel matrix H were to be replaced with $H_{ex}$ to achieve the MMSE principle, the operation of the filter calculating section 11 is the same as that based on the ZF principle except for some sections. Therefore, only the sections whose operation is changed as the result of using the MMSE principle will be described. First, the triangulation section 111-1 performs calculation such that an input value becomes a 2N×N matrix $H_{ex}{}^H$ and a matrix $Q_I$ becomes a 2N×N matrix. The matrix $Q_I$ at the time of output is also a 2N×N matrix. Furthermore, in each THP filter calculating section 113-$m$, since $G^H$=$H_{ex}{}^H$U in the second line, $G^H$ becomes a 2N×N matrix. Since SQRD is performed in the third line with $G^H$ as an input, an output $Q_T$ also becomes a 2N×N matrix, as in the triangulation section. In the fourth line, calculation of P=$Q_T A^{-1}$ based on the ZF principle is replaced with calculation of P=$Q_T$(1:N, 1:N)$A^{-1}$ based on the MMSE principle. In other words, only the upper N rows of $Q_T$ are used. With the addition of these changes, filters based on the MMSE principle can be generated from the ZF principle.

<Nonlinear Precoding Section 13>

Next, the operation of the nonlinear precoding section 13 that performs nonlinear precoding on each data signal s by using the filters P, F, and T calculated for each subcarrier by the filter calculating section 11 will be described in detail.

Figure 4:
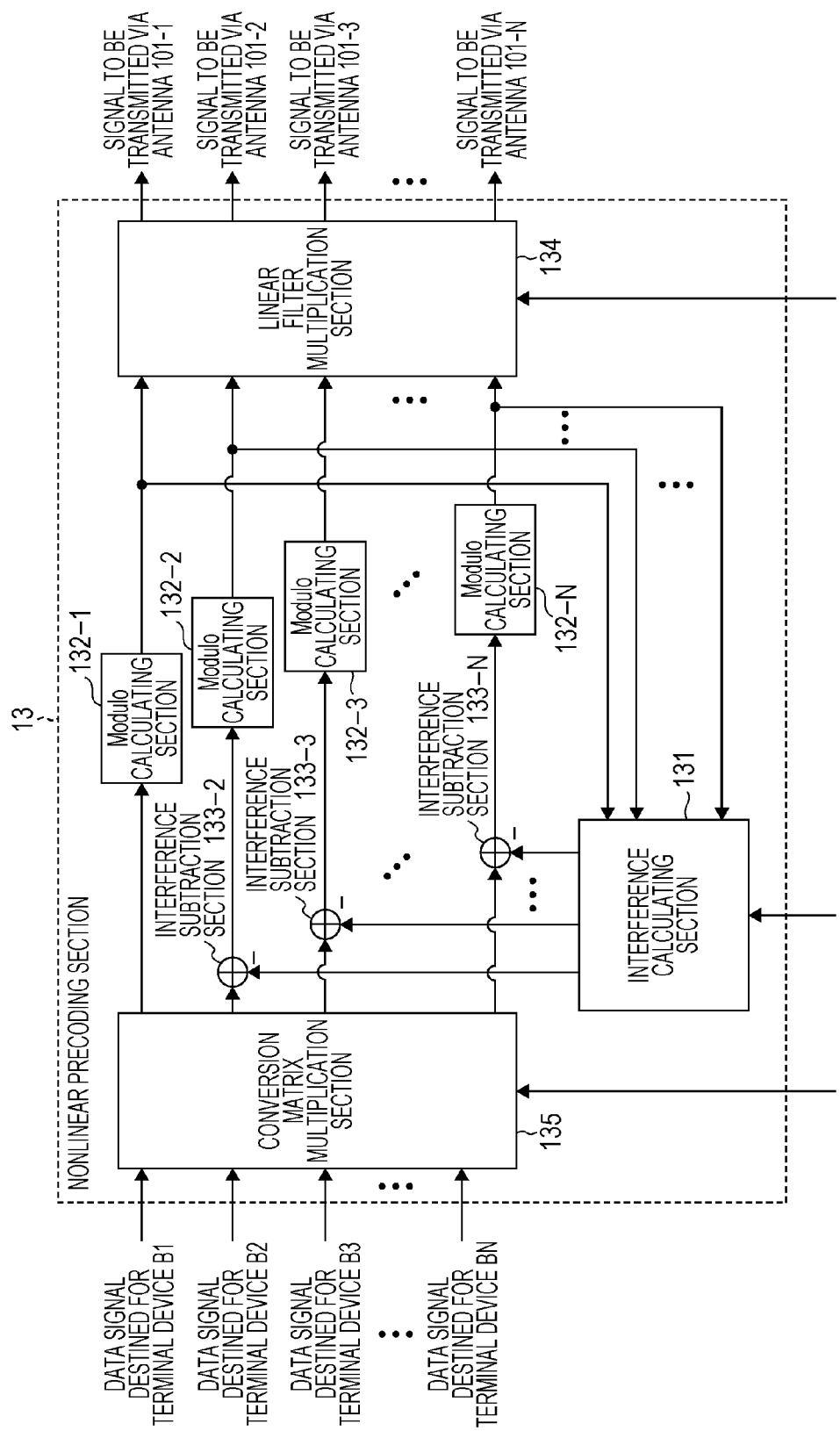
FIG. 4 illustrates a configuration example of a nonlinear precoding section 13.
Figure 5:
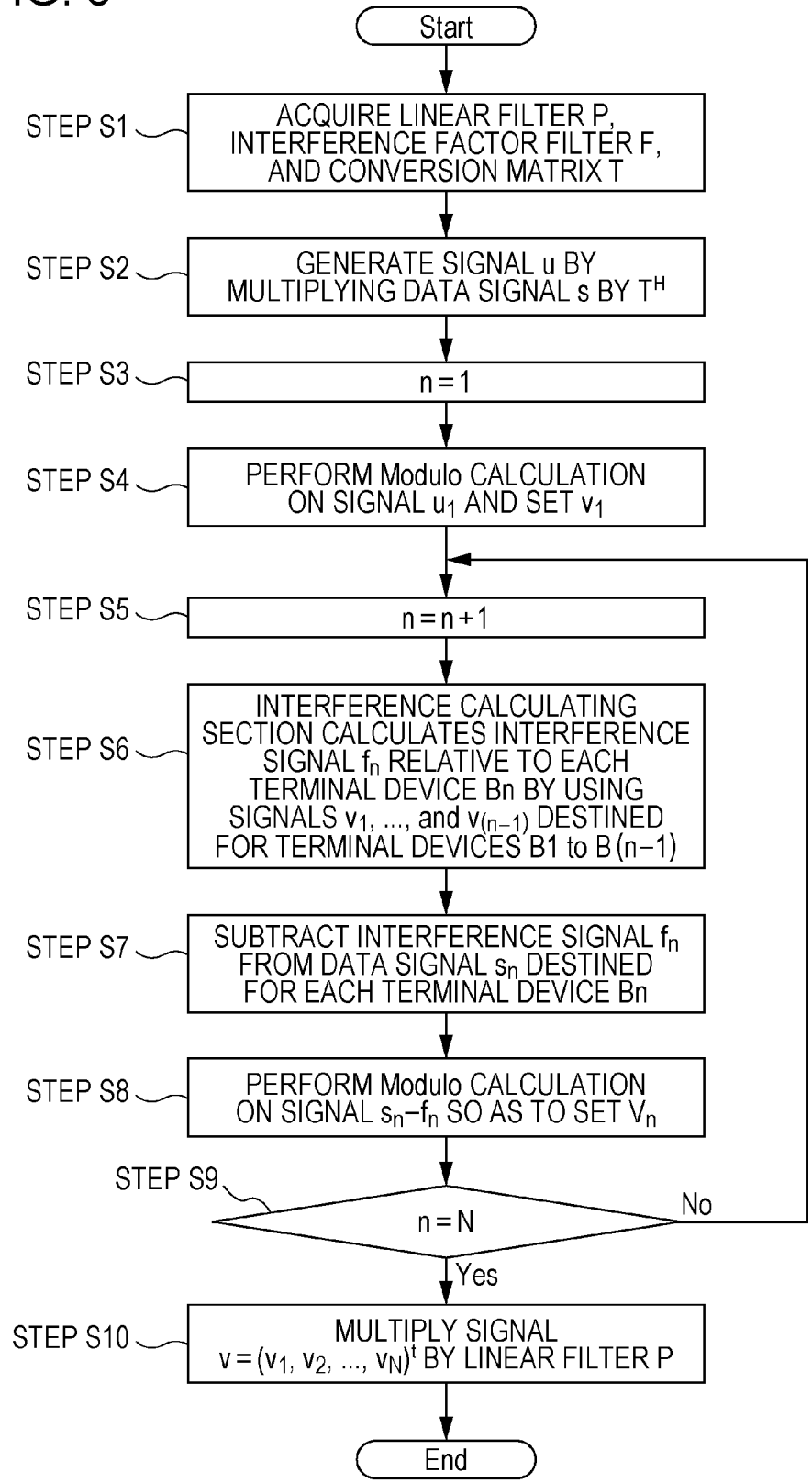
FIG. 5 is a flowchart illustrating the operation of the nonlinear precoding section 13.

FIG. 4 illustrates the configuration of the nonlinear precoding section 13, and FIG. 5 is a flowchart illustrating the operation thereof. FIG. 5 illustrates the operation corresponding to each subcarrier. Unlike the filter calculating section 11, the nonlinear precoding section 13 performs nonlinear precoding on a data signal destined for each terminal device Bn on a subcarrier-by-subcarrier basis. Specifically, the nonlinear precoding section 13 repeats the operation in FIG. 5 for $N_{sc}$ times. The filters P, F, and T in FIG. 5 denote filters input from the filter calculating section 11 for each subcarrier.

The operation performed in the nonlinear precoding section 13 will be sequentially described below.

(Step S1) An interference calculating section 131 and a linear filter multiplication section 134 acquire a feedback filter F, a linear filter P, and a conversion matrix T from the filter calculating section 11.

(Step S2) A data signal s is multiplied by a Hermitian conjugate $T^H$ of the conversion matrix from the left so as to calculate a new signal u expressed by a column vector. In other words, the relationship u=$T^H$s is satisfied.

(Step S3) A value of 1 is substituted into a number n indicating the number of the terminal device undergoing the calculation.

(Step S4) A signal obtained by a modulo calculating section 132-1 performing modulo calculation on a first component $u_1$ of u is set as $v_1$.

(Step S5) (n+1) is substituted into n. In other words, n=2.

(Step S6) The interference calculating section 131 uses the following expression to calculate an interference signal $f_2$ affecting the terminal device B2 by using $v_1$.

[Expression 6]

$$f_2 = F(2,1) \times v_1 \quad (1\text{-}6)$$

In this case, F($n_1$, $n_2$) denotes an $n_1$-th row $n_2$-th column component in a matrix F.

(Step S7) An interference subtraction section 133-2 subtracts $f_2$ from an inherent signal $S_2$ destined for the terminal device B2 so as to calculate a signal $S_2$-$f_2$.

(Step S8) The modulo calculating section 132-2 applies modulo calculation to $S_2$-$f_2$ so as to calculate a signal $v_2$.

(Step S9) Since n=2, the calculation steps (i.e., step S5 to S8) for a signal destined for a subsequent terminal device are performed again from step S5.

Because the processing from step S5 to step S8 is repeated for n=N, processing for calculating a signal destined for an n-th terminal device will be described here as an example.

(Step S5) The value of n is increased by one.

(Step S6) The interference calculating section 131 uses the following expression to calculate an interference signal $f_n$ affecting the terminal device Bn by using $v_1$ to $v_{(n-1)}$.

[Expression 7]

$$f_n = F(n, 1:n-1) \times [v_1, v_2, \ldots, v_{(n-1)}]^t \quad (1\text{-}7)$$

In this case, F(n, 1:n−1) denotes a row vector indicating an n-th-row, first to (n−1)-th column component in the matrix F, and "$^t$" denotes a transposition.

(Step S7) The interference subtraction section 133-$n$ subtracts $f_n$ from an inherent signal $S_n$ destined for the terminal device Bn so as to calculate a signal $S_n - f_n$.

(Step S8) The modulo calculating section 132-$n$ applies modulo calculation to $S_n - f_n$ so as to calculate a signal $v_n$. With this modulo calculation, the transmission signal power destined for each terminal device is reduced.

(Step S9) When n<N, step S5 is performed again. When n=N, the operation proceeds to step S10.

(Step S10) In step S10, a signal obtained by multiplying the signal $v = (v_1, v_2, \ldots, v_N)^t$ by a linear filter P is set as x. As in the first embodiment, components of the signal x are transmission signals to be sequentially transmitted via the antennas 101-1 to 101-N. This signal x is input to the frame forming section 142.

The following description explains that LR-THP is a technology that can properly transmit a data signal by modulo calculation in each terminal device. In the following description, it is assumed that there is no normalization of electric power for sake of simplicity.

First, when a signal is calculated assuming that there are no modulo calculating sections 132-1 to 132-N in the nonlinear precoding section 13, the nonlinear precoding section 13 performs calculation based on the following expression.

[Expression 8]

$$x = P(I+F)^{-1} T^H s \quad (1\text{-}8)$$

In this case, by substituting $P = Q_T A^{-1}$ and $F = R_T^H A^{-1} - I$ into P and F and considering the relationships $G^H \Pi_T = Q_T R_T$ and $G^H = H^H U$, $$\begin{aligned} x &= Q_T A^{-1} \{I + (R_T^H A^{-1} - I)\}^{-1} T^H s \quad [\text{Expression 9}] \\ &= Q_T A^{-1} (R_T^H A^{-1})^{-1} T^H s \\ &= Q_T (R_T^H)^{-1} T^H s = Q_T R_T^{-H} T^H s \\ &= Q_T R_T^{-H} \left( U \prod_T \right)^H s \\ &= Q_T R_T^{-H} \prod_T{}^H U^H s \\ &= \left( Q_T R_T \prod_T{}^{-1} \right)^{-H} U^H s \\ &= G^{-1} U^H s \end{aligned}$$

$$= (U^H H)^{-1} U^H s$$

$$= H^{-1} s \quad (1\text{-}9)$$

Thus, an inverse matrix of the channel matrix, that is, a linear filter based on the ZF principle, is multiplied by the data signal. Furthermore, each of the modulo calculating sections 132-2 to 132-N performs processing on the data signal s so as to add a signal corresponding to an integral multiple of the modulo width to the I-ch or the Q-ch, and this processing can be expressed by the following expression.

[Expression 10]

$$x = H^{-1}(s + z_1 \tau + j z_2 \tau) \quad (1\text{-}10)$$

In this case, $z_1$ and $z_2$ each denote an N dimensional column vector whose components are integers. Specifically, a reception signal of each terminal device Bn is expressed by Hx ($= s + z_1 \tau + j z_2 \tau = y$), which has been multiplied by the channel matrix H. In other words, an n-th component of y becomes the reception signal of the terminal device Bn. The terminal device Bn performs modulo calculation on the reception signal so as to be able to detect a data signal $s_n$ (i.e., an n-th component of S). Although it is described here that there is no normalization of electric power, in actuality, a power normalization coefficient β is multiplied at the base station A1, and channel compensation is performed at each terminal device Bn.

<Equalization Filter Calculating Section>

THP is considered to be a kind of precoding technology. Precoding is also referred to as pre-equalization. Therefore, each THP filter calculating section will also be referred to as "equalization filter calculating section". An equalization filter calculating section is a collective term for "DFE filter calculating section" and "THP filter calculating section" in a second embodiment to be described later.

<DMRS Generating Method>

In a case where the filter calculating section 11 generates filters based on the ZF principle, the DMRS generating section 124 calculates an inverse matrix $H^{-1}$ of the channel matrix H related to a subcarrier that transmits a DMRS (i.e., subcarriers with frequencies $f_1$ and $f_4$ in FIG. 6). In the case of the MMSE principle, a pseudo inverse matrix $H_{ex}^{-1}$ ($= H_{ex}^H (H_{ex} H_{ex}^H)^{-1}$) of $H_{ex}$ is calculated. In the following description, $H^{-1}$ (ZF principle) or an N×N matrix obtained by extracting a first row to an N-th row from $H_{ex}^{-1}$ (MMSE principle) will be referred to as a filter W. The DMRS generating section 124 multiplies the power normalization coefficient β by the reference signal q known in the base station A1 and each terminal device Bn, then multiples an n-th column $w_n$ of the filter W by the product so as to generate a DMRS, and then inputs it to the frame forming section 142. Assuming that the reference signal point shared between the base station A1 and the terminal device Bn is defined as q and the n-th column of the filter W is defined as $w_n$, the DMRS destined for each terminal device Bn becomes an N dimensional column vector $q_n$ expressed by the following expression.

[Expression 11]

$$q_n = \beta q w_n \quad (1\text{-}11)$$

In this case, each component of $q_n$ indicates a signal to be transmitted via each antenna 101-$n$ by a predetermined subcarrier of a predetermined OFDM symbol in the frame forming section 142. The DMRS generating section 124 inputs the generated DMRS to the frame forming section 142.

Figure 8:
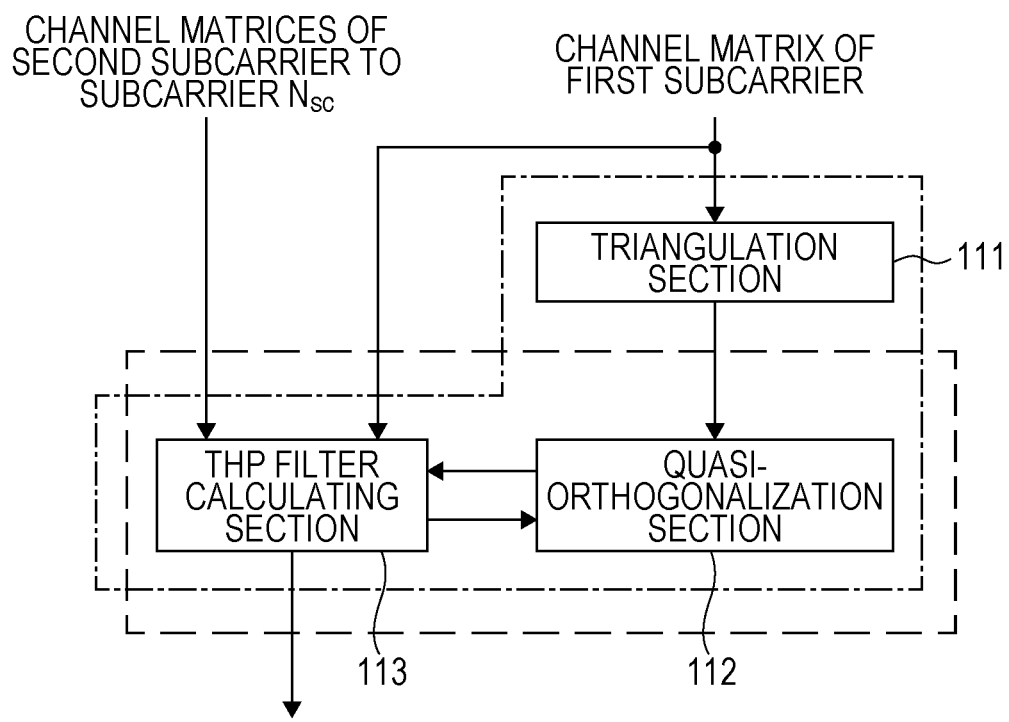
FIG. 8 illustrates an example in which one of quasi-orthogonalization sections 112-1 to 112-$N_{sc}$ and one of THP filter calculating sections 113-1 to 113-$N_{sc}$ are installed, and the quasi-orthogonalization section and the THP filter calculating section are repeatedly used at each subcarrier.

<Reduction of Circuit Size, FIG. 8>

Figure 7:
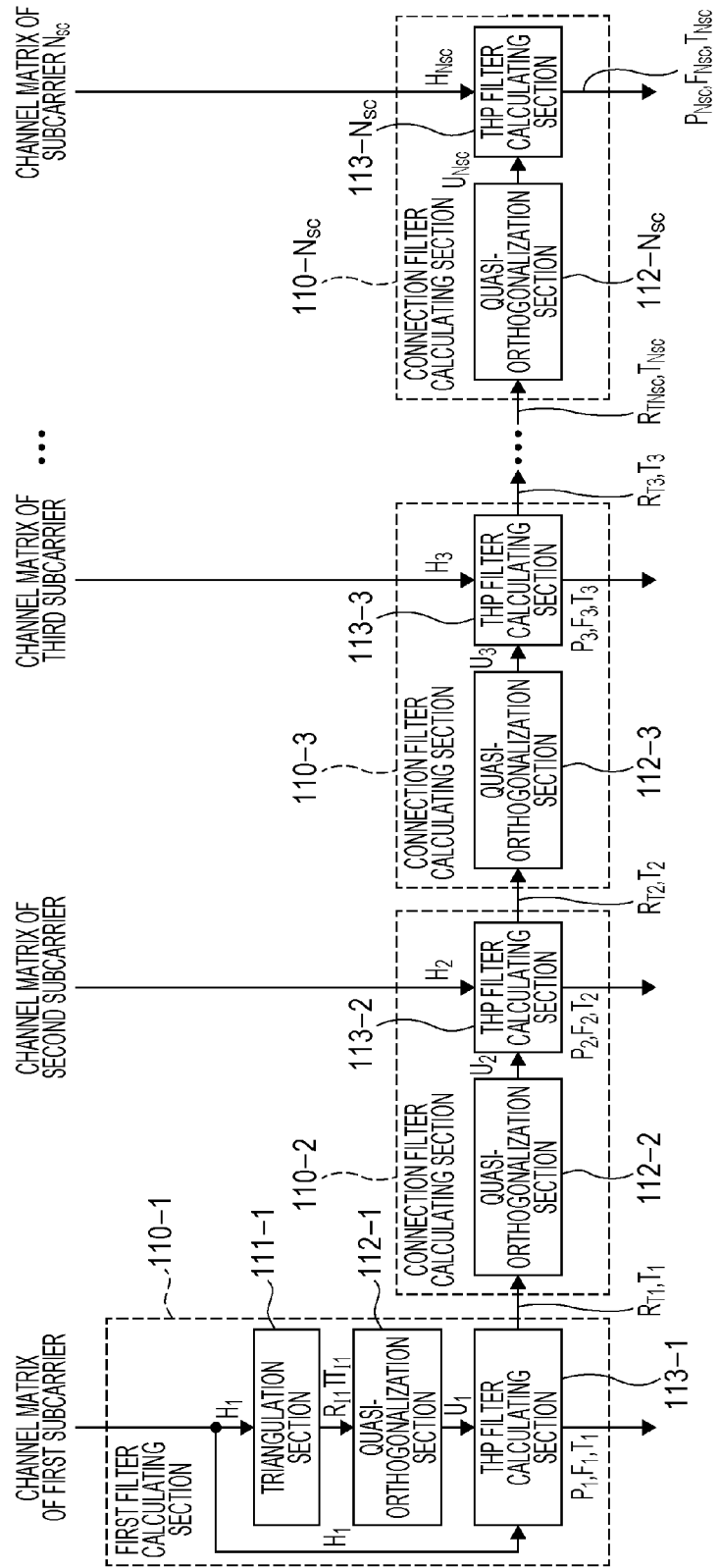
FIG. 7 illustrates the operation of specific components in a filter calculating section 11 (i.e., the operation of a first filter calculating section 110-1 and the operation of connection filter calculating sections 110-2 to 110-$N_{sc}$).

Although the filter calculating section 11 can be realized with the configuration shown in FIG. 7, one of the quasi-orthogonalization sections 112-1 to 112-$N_{sc}$ and one of the THP filter calculating sections 113-1 to 113-$N_{sc}$ may be installed, as shown in FIG. 8, such that the quasi-orthogonalization section and the THP filter calculating section may be repeatedly used at each subcarrier. FIG. 8 illustrates an example.

The filter calculating section 11 shown in FIG. 8 has three components, which are a triangulation section 111, a quasi-orthogonalization section 112, and a THP filter calculating section 113.

First, a channel matrix $H_1$ of the first subcarrier is input to the triangulation section 111, and matrices $R_{T1}$ and $\Pi_{T1}$ calculated by performing triangulation processing are input to the quasi-orthogonalization section 112. The quasi-orthogonalization section 112 calculates a unimodular matrix $U_1$ and inputs it to the THP filter calculating section 113. The THP filter calculating section 113 calculates filters $P_1$, $F_1$, and $T_1$ to be used for nonlinear precoding from the unimodular matrix $U_1$ and the channel matrix $H_1$ of the first subcarrier, and inputs them to the nonlinear precoding section 13. Moreover, the THP filter calculating section 113 inputs a THP triangular matrix $R_{T1}$ and a conversion matrix $T_1$ to the quasi-orthogonalization section 112. The above processing corresponds to the first filter calculating section 110-1 in FIG. 7.

Subsequently, the quasi-orthogonalization section 112 calculates a new unimodular matrix $U_2$ by using the THP triangular matrix $R_{T1}$ and the conversion matrix $T_1$ input from the filter calculating section and inputs it to the THP filter calculating section 113. The THP filter calculating section 113 calculates filters $P_2$, $F_2$, and $T_2$ to be used for nonlinear precoding for the second subcarrier by using the newly input unimodular matrix $U_2$ and a channel matrix $H_2$ corresponding to the second subcarrier, and inputs a THP triangular matrix $R_{T2}$ and a conversion matrix $T_2$ to the quasi-orthogonalization section 112. The above processing corresponds to the connection filter calculating section 110-2 in FIG. 7.

Subsequently, the quasi-orthogonalization section 112 calculates a unimodular matrix $U_{(m-1)}$ from a THP triangular matrix $R_{Tm}$ and a conversion matrix $T_m$, and the THP filter calculating section 113 calculates filters $P_{(m+1)}$, $F_{(m+1)}$, and $T_{(m+1)}$ to be used for nonlinear precoding for a subcarrier (m+1). Consequently, the same processing can be achieved with a circuit size smaller than that in FIG. 7.

<Subchannel-by-Subchannel Basis Instead of Subcarrier-by-Subcarrier Basis>

There is a case where each terminal device Bn notifies the channel-state information on a subchannel-by-subchannel basis, each subchannel including a plurality of subcarriers, instead of on a subcarrier-by-subcarrier basis. In such a case, a first filter calculating section or a connection filter calculating section may be disposed for each subchannel, and the base station A1 may calculate filters corresponding to each subchannel sequentially from the first filter calculating section. However, even in the case where the notification is performed on a subchannel-by-subchannel basis, a channel matrix may be interpolated by using, for example, linear interpolation, secondary interpolation, FFT interpolation, or Sinc function interpolation, and if it is ascertained that the channel-state information is substantially notified for each subcarrier, it is not necessary to calculate filters on a subchannel-by-subchannel basis. Instead, the filter calculation may be performed on a subcarrier-by-subcarrier basis, as first described.

<Number of Physical Antennas and Number of Imaginary Antennas>

In this embodiment, the number of antennas provided at the base station A1 is equal to the number N of terminal devices Bn subject to multiplexing, and each terminal device Bn has one antenna. However, the number of antennas does not necessarily need to indicate the number of physical antennas (i.e., the actual number of antennas provided at the base station A1). For example, supposing that the base station A1 has (N+N') antennas, the base station A1 can communicate with the terminal devices Bn assuming that the base station A1 imaginarily has N antennas based on a transmission diversity technology. Furthermore, if some of the antennas are simply not to be used, it can be considered that the base station A1 has N antennas.

Although each terminal device Bn is described as having one antenna, each terminal device Bn may have multiple antennas. With a reception diversity technology, for example, the terminal device Bn may perform communication based on the assumption that it equivalently has one antenna. In this embodiment, with regard to two terminal devices (e.g., a terminal device Bp and a terminal device Bq (p≠q)), the base station A1 treats them as two different terminal devices. In actuality, this embodiment is applicable to a case where each terminal device has multiple antennas and operates as two terminal devices, that is, the terminal device Bp and the terminal device Bq.

This relationship is the same in the following embodiment.

<Simulation>

Figure 17:
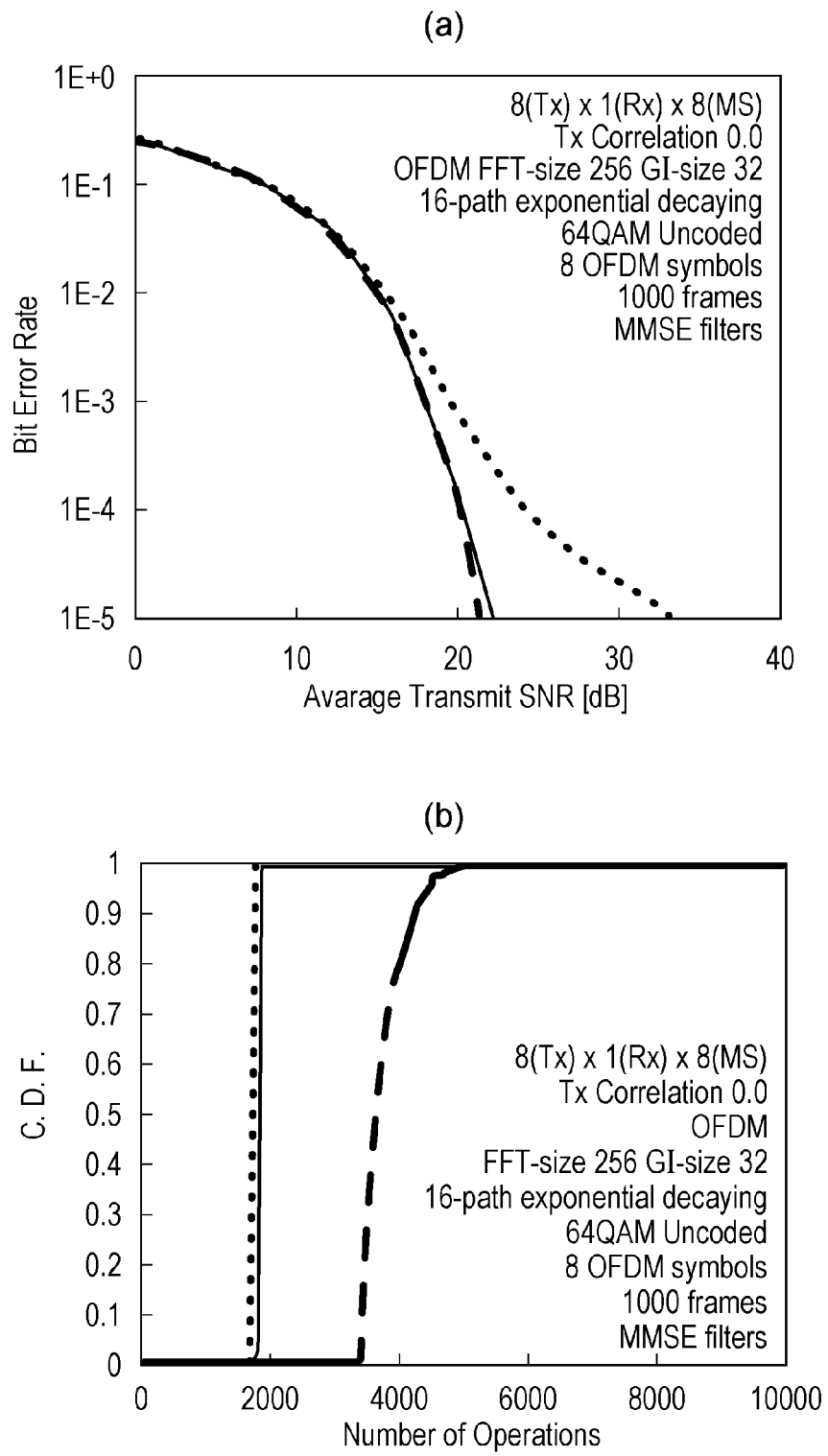
FIG. 17 illustrates computer simulation results for describing the advantages of the first embodiment.

The advantages of this embodiment will be described below with reference to computer simulation results. FIG. 17(a) illustrates bit error rate characteristics in this embodiment (solid line), the THP method in the related art (dotted line) that does not use LR, and the LR-THP method (dashed line) using the LR method (SQRD-LLLA) discussed in Non Patent Literature 5. As shown in FIG. 17(a), this embodiment has substantially the same characteristic as that of the LR-THP method in the related art and has a significantly improved characteristic relative to that of the THP method that does not perform LR.

Furthermore, FIG. 17(b) illustrates the cumulative distribution function (C.D.F.) of the amount of calculation per subcarrier (i.e., the number of times a floating point number of a complex number is multiplied). The amount of calculation in the LR-THP method (dashed line) using SQRD-LLLA is distributed about 4,000 times, whereas the amount of calculation in the method according to this embodiment (solid line) is reduced to about 2,000 times, which is substantially the same as that in the THP method in the related art (dotted line) that does not perform LR. In other words, in this embodiment, the number of times triangulation processing, which has a dominant amount of calculation in LR processing, is reduced by utilizing the result of THP filter calculation processing so that the amount of calculation required for LR processing can be reduced to a substantially negligible level, as compared to THP filter calculation processing.

This embodiment that can achieve the favorable characteristic of the LR-THP method in the related art with the same amount of calculation as in the THP method that does not perform LR processing is an extremely advantageous method.

<First Modification>

Figure 9:
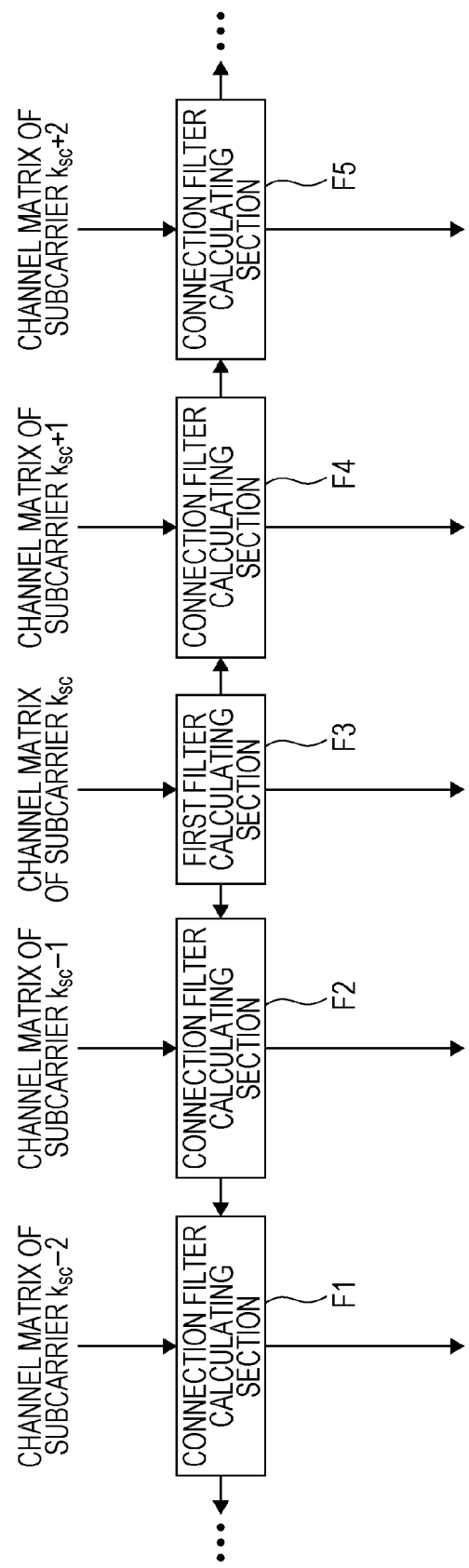
FIG. 9 illustrates a configuration that performs processing including performing calculation at a first filter calculating section F3 corresponding to an intermediate subcarrier $k_{sc}$, inputting a THP triangular matrix $R_T$ and a conversion matrix T to connection filter calculating sections F2 and F4 respectively corresponding to a subcarrier with a frequency lower than the above by one and a subcarrier with a frequency higher than the above by one, and subsequently performing calculation at connection filter calculating sections F1, F5, and so on sequentially for subcarriers with higher and lower frequencies.

In the first embodiment, the filters P, F, and T are calculated starting from the subcarrier with the lowest (or highest) frequency, as shown in FIG. 7. Alternatively, for example, as shown in FIG. 9, after performing the calculation at a first filter calculating section F3 corresponding to an intermediate subcarrier $k_{sc}$, the THP triangular matrix $R_T$ and the conversion matrix T may be input to connection filter calculating sections F2 and F4 respectively corresponding to a subcarrier with a frequency lower than the above by one and a subcarrier with a frequency higher than the above by one. Subsequently, the calculation may be sequentially performed at connection filter calculating sections F1, F5, and so on corresponding to subcarriers with higher and lower frequencies.

<Second Modification>

Figure 10:
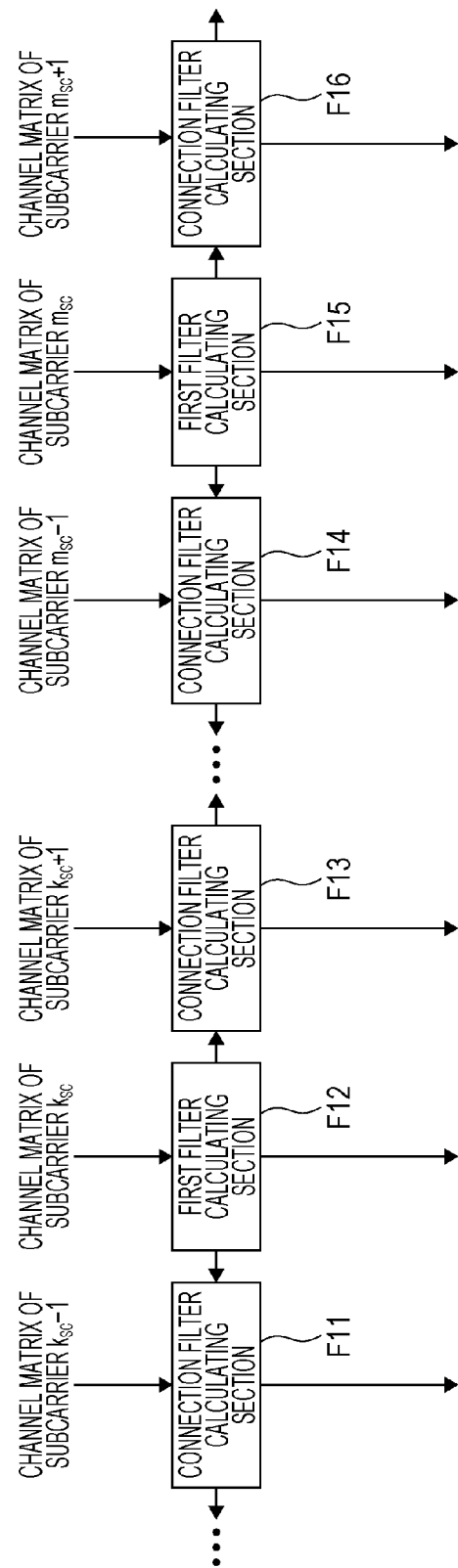
FIG. 10 is a diagram in which first filter calculating sections F12 and F15 are respectively disposed for a subcarrier $k_{sc}$ and a subcarrier $m_{sc}$ that are different from each other, and connection filter calculating sections F11, F13, F14, and F16 are disposed for adjoining subcarriers.

Referring to FIG. 10, the number of first filter calculating sections does not need to be one, and multiple first filter calculating sections may be provided. In that case, first filter calculating sections F12 and F15 may be respectively disposed in correspondence with a subcarrier $k_{sc}$ and a subcarrier $m_{sc}$ that are different from each other, and connection filter calculating sections F11, F13, F14, and F16 may be disposed in correspondence with adjoining subcarriers. In this case, filter calculation processing can be performed currently for subcarriers adjoining the subcarrier $k_{sc}$ and for subcarriers adjoining the subcarrier $m_{sc}$, whereby the time required for the overall filter calculation can be reduced.

In other words, the second modification can be considered as a method in which the communication band is divided into multiple bands, a first filter calculating section is provided in correspondence with one subcarrier for each band, connection filter calculating sections are provided in correspondence with other subcarriers for the respective bands, and the result of the first filter calculating section within the same band is sequentially utilized in the connection filter calculating sections.

<Third Modification>

The second modification is described as being a method in which multiple connected bands for sequentially calculating filters are provided. Alternatively, these bands may be appropriately changed in accordance with the channel state of each subcarrier. In this embodiment, the more similar the channel states of adjoining subcarriers, the higher the characteristics. Therefore, for example, when a correlated threshold value or higher is reached at two adjoining subcarriers, a boundary may be set for the "bands" described in the second modification. Thus, subcarriers whose channel states are highly similar to each other can be collectively set in correspondence with a single "band", thereby minimizing deterioration in the method according to this embodiment caused by channel fluctuations.

<Fourth Modification>

Figure 16:
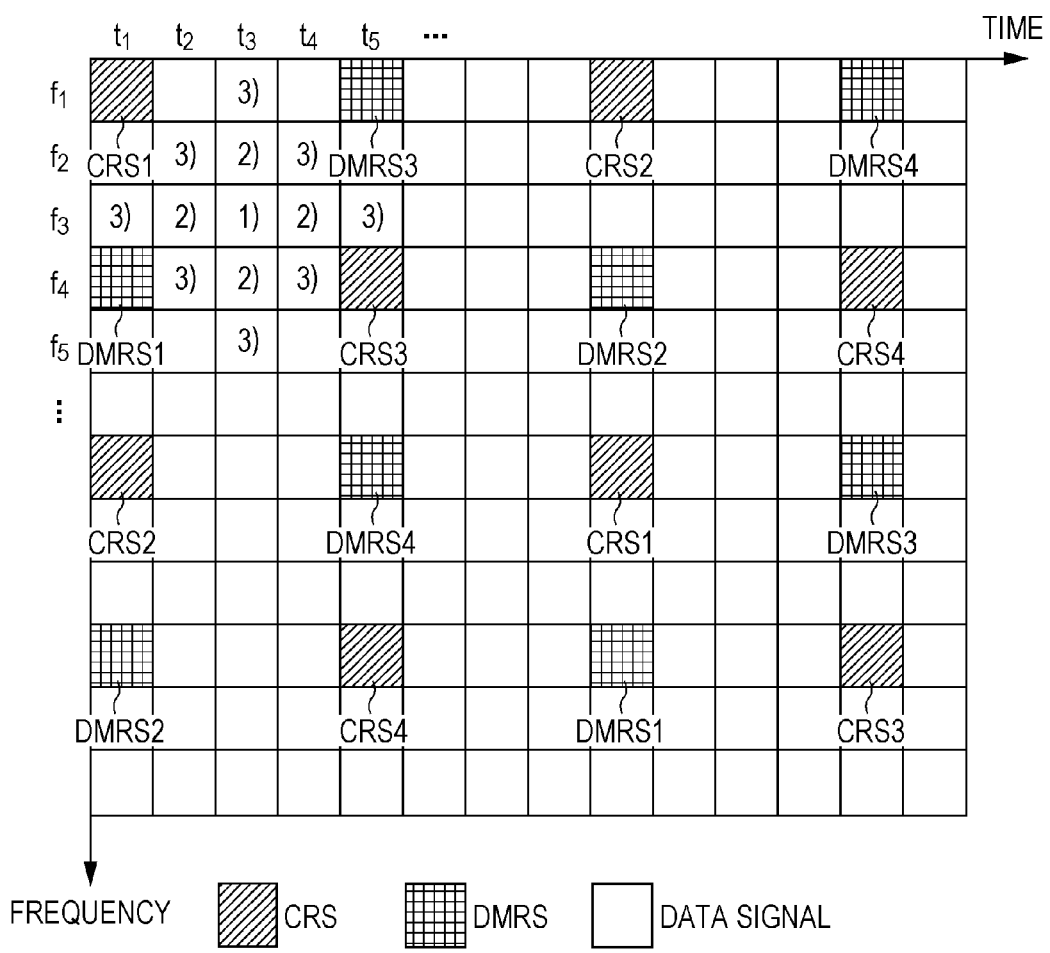
FIG. 16 illustrates how the THP triangular matrix $R_T$ and the conversion matrix T are reutilized in a time-axis direction.

The technology for reducing the amount of calculation by utilizing the correlation of channels of adjoining subcarriers shown in FIGS. 7, 9, and 10 is applicable to adjoining OFDM symbols in the time-axis direction. The same subcarrier in adjoining OFDM symbols in the time-axis direction has high correlation with respect to the channel state, as in adjoining subcarriers in the same OFDM symbol. Therefore, a THP triangular matrix $R_T$ and a conversion matrix T of a certain subcarrier calculated at a certain OFDM symbol may be utilized for the same subcarrier in one preceding or following OFDM symbol. FIG. 16 illustrates an example. A first filter calculating section is provided for a resource element shown as 1) in FIG. 16, and LR-THP filters (P, F, and T) are calculated. Subsequently, the THP triangular matrix $R_T$ and the conversion matrix T may be used for resource elements given the symbol 2), namely, not only for adjoining subcarriers but also for the same subcarrier of adjoining OFDM symbols. Furthermore, filter calculation processing is performed on 3) by using the result of 2), whereby calculation can be performed sequentially not only in the frequency-axis direction but also in the time-axis direction.

By reutilizing the THP triangular matrix $R_T$ and the conversion matrix T also in the time-axis direction, as in FIG. 16, the amount of calculation can be further reduced, as compared with the case where the matrices are reutilized only in the frequency-axis direction. Alternatively, the matrices may be reutilized only in the time-axis direction.

<Fifth Modification>

Figure 21:
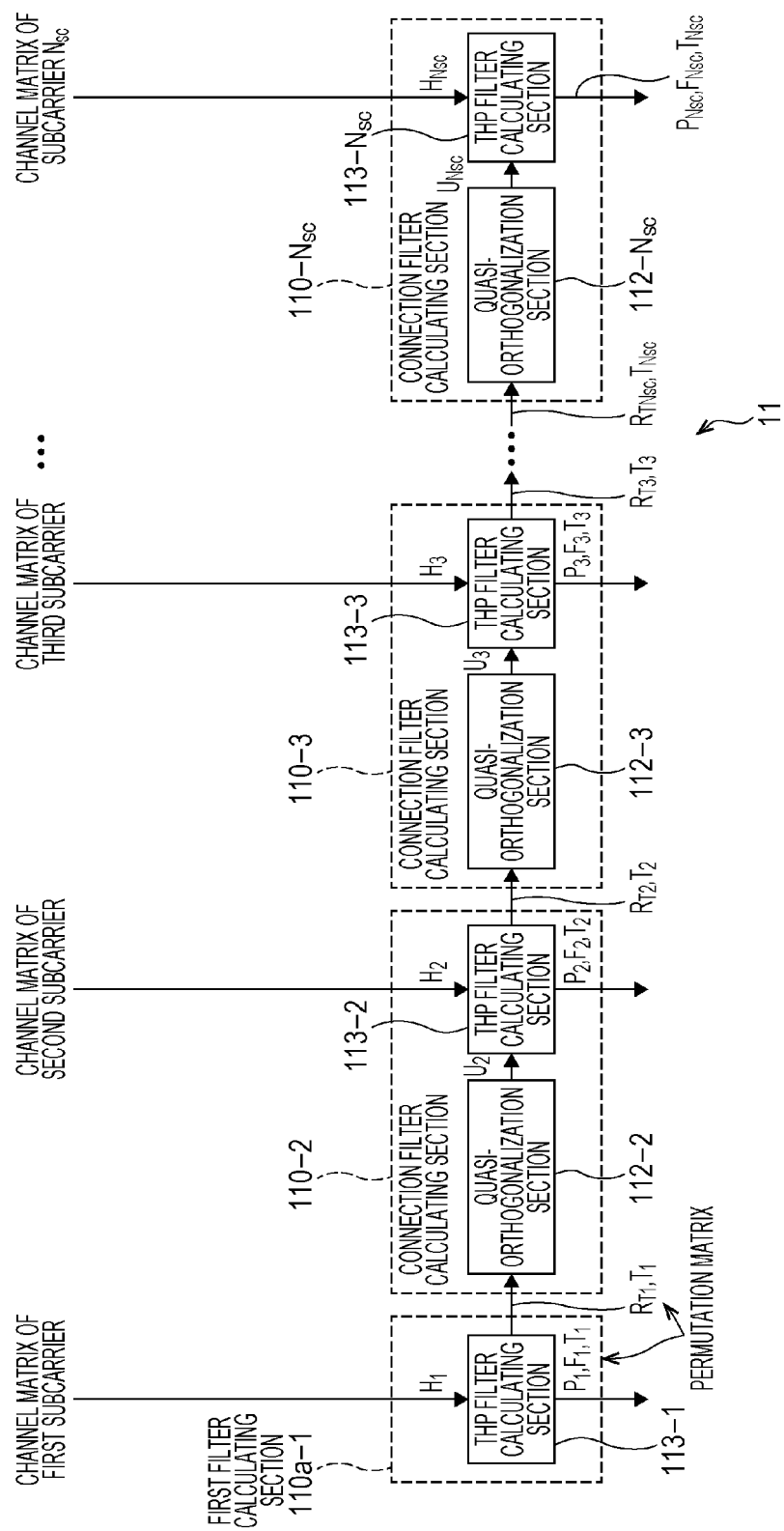
FIG. 21 illustrates the configuration of a filter calculating section 11 according to a fifth modification of the present invention.

FIG. 21 illustrates the configuration of a filter calculating section 11 according to this modification. Unlike FIG. 7, filter calculation based on THP is performed in the first filter calculating section 110a-1 without performing LR processing therein. In a first filter calculating section 110a-1 according to this modification, a channel matrix $H_1$ of the first subcarrier is directly input to the THP filter calculating section 113-1. As shown in FIG. 13, the THP filter calculating section 113-1 requires the channel matrix $H_1$ and a unimodular matrix as inputs. Since the algorithm shown in FIG. 13 is described with regard to an arbitrary subcarrier, a subcarrier number provided as a suffix has been omitted. Since the operation of the first subcarrier is described here, the channel matrix H is indicated as $H_1$. With regard to $T_1$, $\Pi_{T1}$, $P_2$, $F_2$, and $T_2$ described below, corresponding subcarrier numbers are similarly given thereto as suffixes.

In this modification, an N-row by N-column unit matrix is input in place of a unimodular matrix. A permutation matrix $\Pi_{T1}$ is output, and the nonlinear precoding section 13 and the connection filter calculating section 110-2 calculate the filters $P_2$, $F_2$, and $T_2$ by using the permutation matrix $\Pi_{T1}$ in place of the conversion matrix $T_1$.

<Sixth Modification>

Each quasi-orthogonalization section according to the above embodiment may use LLLA in place of JQO that requires a small amount of calculation. In order to use LLLA in this embodiment, an algorithm shown in FIG. 25 is used at each quasi-orthogonalization section 112-$k_{sc}$ ($k_{sc}$=1, 2, . . . , $N_{sc}$).

The procedure shown in FIG. 25 will now be described. A Givens rotation matrix G is given by an expression in FIG. 25.

Zero-th line: matrices $R_I$ and $\Pi_I$ are acquired as inputs.

First line: N×N matrices $M_I$ (=$I_N$) and $R_L$ (=$R_I$) are defined.

Second line: a value of 1 is substituted into a variable k.

Third line: the third to fourteenth lines are repeated so long as k≤N is satisfied.

Fourth line: the fifth to seventh lines are repeated for i=(k−1) to 1. In other words, the value of i is decremented by one from (k−1) every time the processing of each loop is performed.

Fifth line: "$R_L$(i, k)/$R_L$(i, i)" is substituted into a Gaussian integer μ. In this case, "x" is a function similar to the closest integer individually for the values of the solid part and the imaginary part of a complex number x. For example, 2.1−3.6j=2−4j.

Sixth line: $R_L$(1:i, k)−μ$R_L$(1:i, i) is substituted into $R_L$(1:i, k).

Seventh line: M(:, k)−μM(:, i) is substituted into M(:, k).

Eighth line: the fifth to seventh lines are repeated for i=(k−1) to 1.

Ninth line: the tenth to twelfth lines are executed if δ|$R_L$(k−1, k−1)|$^2$≥|$R_L$(k, k)|$^2$+|$R_L$(k−1, k)|$^2$ is satisfied. If not satisfied, the fourteenth line is executed. In this case, δ denotes an arbitrary real number ranging between ¼ and 1. Generally, it is desirable that δ=¾.

Tenth line: a (k−1)-th column and a k-th column of each of $R_L$ and M are switched.

Eleventh line: a matrix obtained by extracting a (k−1)-th row and a k-th row from $R_L$ is multiplied by the Givens rotation matrix G, written at the lower section of FIG. 25, from the right.

Twelfth line: the larger one of (k−1) and 1 is substituted into k.

(Thirteenth line: conditional branching in the ninth line is indicated.)

Fourteenth line: (k+1) is substituted into k.

(Fifteenth line: an end point of the conditional branching process in the ninth line is indicated.)

Sixteenth line: an end point of the "while" loop in the third line is indicated.

Seventeenth line: a matrix U (=$\Pi_I$M) is defined.

Eighteenth line: the matrix U is output.

Accordingly, by performing the algorithm shown in FIG. 25 in each quasi-orthogonalization section 112-$k_{sc}$ within the filter calculating section 11, an LLLA algorithm can be applied in this embodiment in place of JQO.

<Seventh Modification>

The THP filter calculating sections 113-1 to 113-N$_{sc}$ according to this embodiment calculate filters by using the SQRD-THP algorithm based on FIG. 13. This embodiment can be alternatively applied by replacing this algorithm with VBLAST-THP shown in FIG. 26.

The procedure shown in FIG. 26 will now be described.

Zero-th line: matrices H and U are acquired as inputs.

First line: an N×N matrix G is defined, and $G^H = H^H U$ is set. Moreover, a matrix $\Pi_T$ is defined, and a unit matrix $I_N$ is substituted therein.

Second line: an aggregate of components having integers 1 to N is defined as κ.

Third line: a matrix G' (=G) is defined.

Fourth line: the fifth to tenth lines are repeated for i=N to 1.

Fifth line: a matrix P is defined, and an inverse matrix of the matrix G' is substituted therein. If the matrix G' is not a nonsingular matrix, a pseudo inverse matrix ($G'^+ = G'^H (G'G'^H)^{-1}$) is substituted into the matrix P. In this case, "+" denotes the pseudo inverse matrix.

Sixth line: the number of the column with the smallest norm among the columns in the matrix P indicated by the numbers existing in κ is set as $k_i$. For example, if κ={2, 3, 5}, the number of the column with the smallest norm among the second, third, and fifth columns is set as $k_i$.

Seventh line: a column vector $p_i$ is defined, and the $k_i$-th column of the matrix P is substituted therein.

Eighth line: ($e_{ki} - Gp_i$) is substituted into an i-th column of the matrix F. In this case, $e_{ki}$ denotes an N dimensional column vector in which a $k_i$-th component is 1 and the remaining components are all zero. Because F is not defined at the first "For loop" (i=N) indicated in the fourth line, the aforementioned substitution is performed after defining the matrix F as an N×N matrix in which all of the components are zero.

Ninth line: the component $k_i$ is deleted from the aggregate κ.

Tenth line: all of the components of a $k_i$-th column of the matrix G' are set to zero.

Eleventh line: the fourth to tenth lines are repeated for i=N to 1.

Twelfth line: the column vector $p_i$ is substituted into an i-th column of the matrix P. In this case, i denotes all of the numbers from 1 to N, and the substitution is performed on all of the columns.

Thirteenth line: the columns of the matrix $\Pi_T$ are rearranged in the order [$k_1, k_2, \ldots, k_N$].

Fourteenth line: a matrix T is defined, and $U\Pi_T$ is substituted therein.

Fifteenth line: a matrix $R_T$ is defined, and $(I=\Pi_T^H F)^H$ is substituted therein.

Sixteenth line: the matrices P, F, T, and $R_T$ are output.

Because VBLAST-THP has better characteristics than SQRD-THP, good error rate characteristics can be achieved, as compared with the method that uses SQRD-THP.

Second Embodiment

LR-DFE

In this embodiment, the amount of calculation in a receiving device based on SU-MIMO can be reduced. SU-MIMO is a method in which a transmitting device uses multiple antennas to spatially multiplex and transmit multiple data signals with the same frequency and at the same time to a single receiving device. In this embodiment, for example, a base station A2 serves as the transmitting device and a terminal device C serves as the receiving device. Alternatively, the base station A2 may serve as the receiving device and the terminal device C may serve as the transmitting device. Furthermore, in this embodiment, an example in which N streams of data are transmitted based on SU-MIMO by using N antennas will be described.

Figure 18:
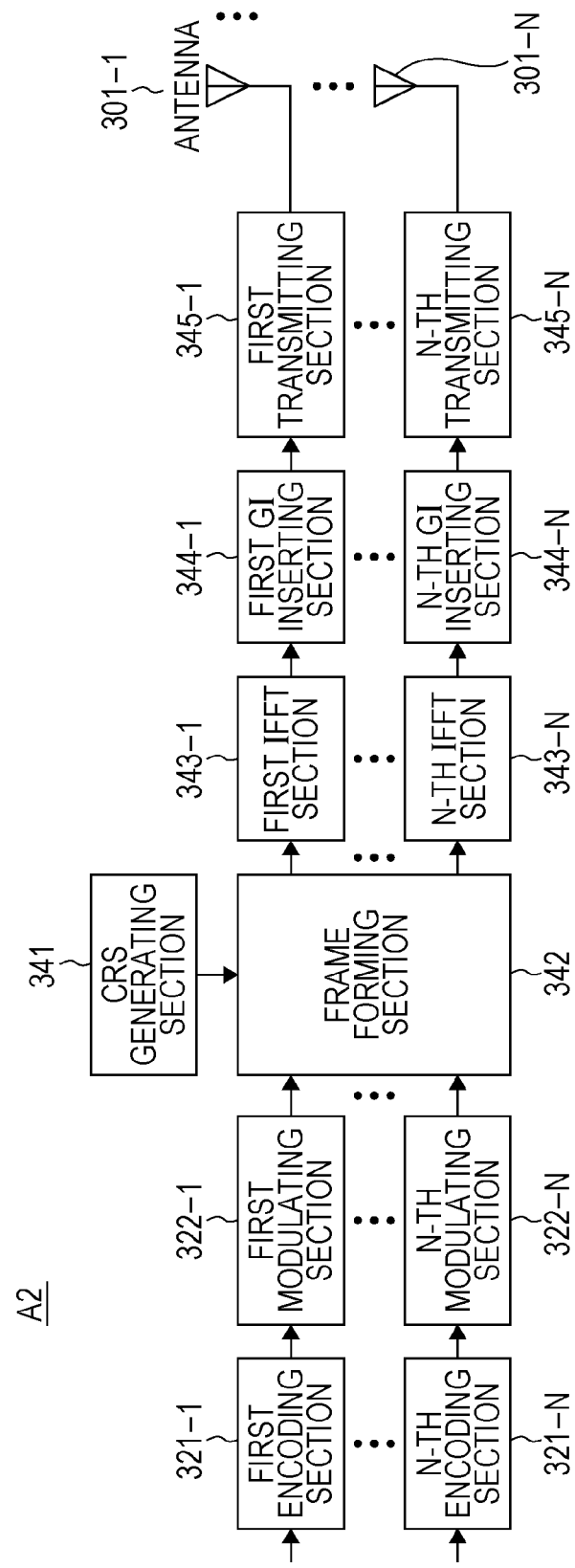
FIG. 18 is a schematic block diagram illustrating the configuration of a base station A2 according to a second embodiment.

FIG. 18 is a schematic block diagram illustrating the configuration of the base station A2 according to this embodiment. The base station A2 includes first to N-th encoding sections 321-1 to 321-N, first to N-th modulating sections 322-1 to 322-N, a CRS generating section 341, a frame forming section 342, first to N-th IFFT sections 343-1 to 343-N, first to N-th GI inserting sections 344-1 to 344-N, and first to N-th transmitting sections 345-1 to 345-N.

The encoding section 321-$n$ receives information bits (data) of an n-th stream of the terminal device C. The encoding section 321-$n$ performs error-correction encoding on the received information bits and outputs the encoded bits to the modulating section 322-$n$ after the encoding process.

The modulating section 322-$n$ modulates the encoded bits input from the encoding section 321-$n$ so as to generate a data signal of the n-th stream of the terminal device C. The modulating section 322-$n$ inputs the generated data signal to the frame forming section 342.

The CRS generating section 341 generates a CRS having signal points (reference signals) known in the base station A2 and the terminal device C, and outputs the generated CRS to the frame forming section 342.

The frame forming section 342 maps the data signal acquired from the modulating section 322-$n$ and the CRS acquired from the CRS generating section 341 in an arrangement as shown in FIG. 6. Although DMRSs are mapped in FIG. 6, since a frame according to this embodiment does not need to transmit a DMRS to the terminal device C, data signals are mapped in the resource elements corresponding to the DMRSs in FIG. 6.

The frame forming section 342 outputs a signal to be transmitted via an antenna 301-$n$ after the signal mapping process to the IFFT section 343-$n$ on a frame-by-frame basis (the same processing is performed for n=1, 2, . . . , N).

The IFFT section 343-$n$ performs IFFT on the signal input from the frame forming section 342 so as to generate a time-domain signal. The IFFT section 343-$n$ performs the IFFT on a frame-by-frame basis. The IFFT section 343-$n$ outputs the generated time-domain signal to the GI inserting section 344-$n$.

The GI inserting section 344-$n$ adds a guard interval to the signal input from the IFFT section 343-$n$ and outputs the signal to the transmitting section 345-$n$ after the adding process.

The transmitting section 345-$n$ performs D/A (digital/analog) conversion on the signal (i.e., baseband digital signal) input from the GI inserting section 344-$n$. The transmitting section 345-$n$ performs up-conversion on the converted signal so as to generate a carrier frequency signal. The transmitting section 345-$n$ transmits the generated signal via the antenna 301-$n$.

Figure 19:
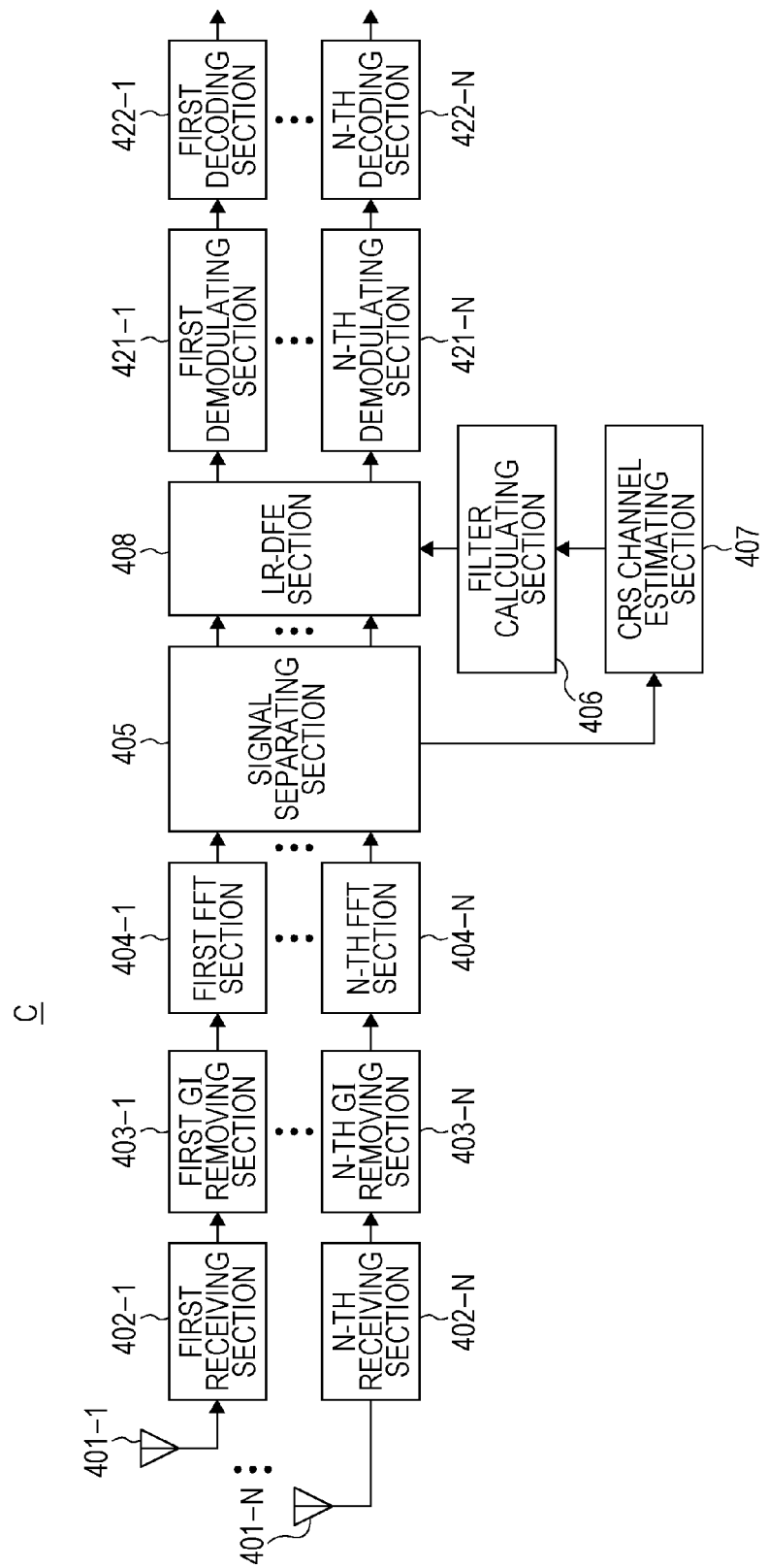
FIG. 19 is a schematic block diagram illustrating the configuration of a terminal device C according to the second embodiment.

FIG. 19 is a schematic block diagram illustrating the configuration of the terminal device C according to this embodiment. The terminal device C includes first to N-th receiving sections 402-1 to 402-N, first to N-th GI removing sections 403-1 to 403-N, first to N-th FFT sections 404-1 to 404-N, a signal separating section 405, a CRS channel estimating section 407, a filter calculating section 406, an LR-DFE section 408, first to N-th demodulating sections 421-1 to 421-N, and first to N-th decoding sections 422-1 to 422-N.

The receiving section 402-$n$ receives a signal (i.e., a carrier frequency signal) transmitted from the base station A2 via an antenna 401-$n$. The receiving section 402-$n$ performs down-conversion on the received signal and performs A/D (analog/digital) conversion so as to generate a baseband digital signal. The receiving section 402-$n$ outputs the generated digital signal to the GI removing section 403-$n$.

The GI removing section 403-$n$ removes GI from the digital signal input from the receiving section 402-$n$ and outputs the signal to the FFT section 404-$n$ after the removing process.

The FFT section 404-$n$ performs FFT on the signal input from the GI removing section 403-$n$ so as to generate a frequency-domain signal. The FFT section 404-$n$ outputs the generated frequency-domain signal to the signal separating section 405.

The signal separating section 405 separates the signal input from the FFT section 404 on the basis of mapping information notified from the base station A2. Of the separated signals, the signal separating section 405 outputs the CRS to the CRS channel estimating section 407. The signal separating section 405 outputs a signal (e.g., a data signal) other than the CRS to the LR-DFE section 408.

The CRS channel estimating section 407 estimates a channel state on the basis of the CRS input from the signal separating section 405. In this case, the channel state is expressed by each of N-row by N-column channel matrices $H_1$ to $H_{N_{sc}}$ for the respective subcarriers. The suffix provided after H indicates the number of a subcarrier. The CRS channel estimating section 407 inputs each of the estimated channel matrices $H_1$ to $H_{N_{sc}}$ to the filter calculating section 406.

The filter calculating section 406, which is the characteristic part of this embodiment, calculates filters to be used for signal detection for each subcarrier by LR processing and inputs each filter to the LR-DFE section 408. Detailed operation will be described later.

The LR-DFE section 408 detects a data signal by using the filters input from the filter calculating section 406 and inputs an equalization result to each of the first to N-th demodulating sections 421-1 to 421-N. Detailed operation of the LR-DFE section 408 will also be described later.

The demodulating section 421-$n$ performs demodulation by using each n-th stream equalization result output from the LR-DFE section and inputs each demodulation result to the decoding section 422-$n$.

The decoding section 422-$n$ decodes an error-correcting code by using each demodulation result from the demodulating section 421-$n$ and outputs information bits.

<Filter Calculating Section 406>

Figure 20:
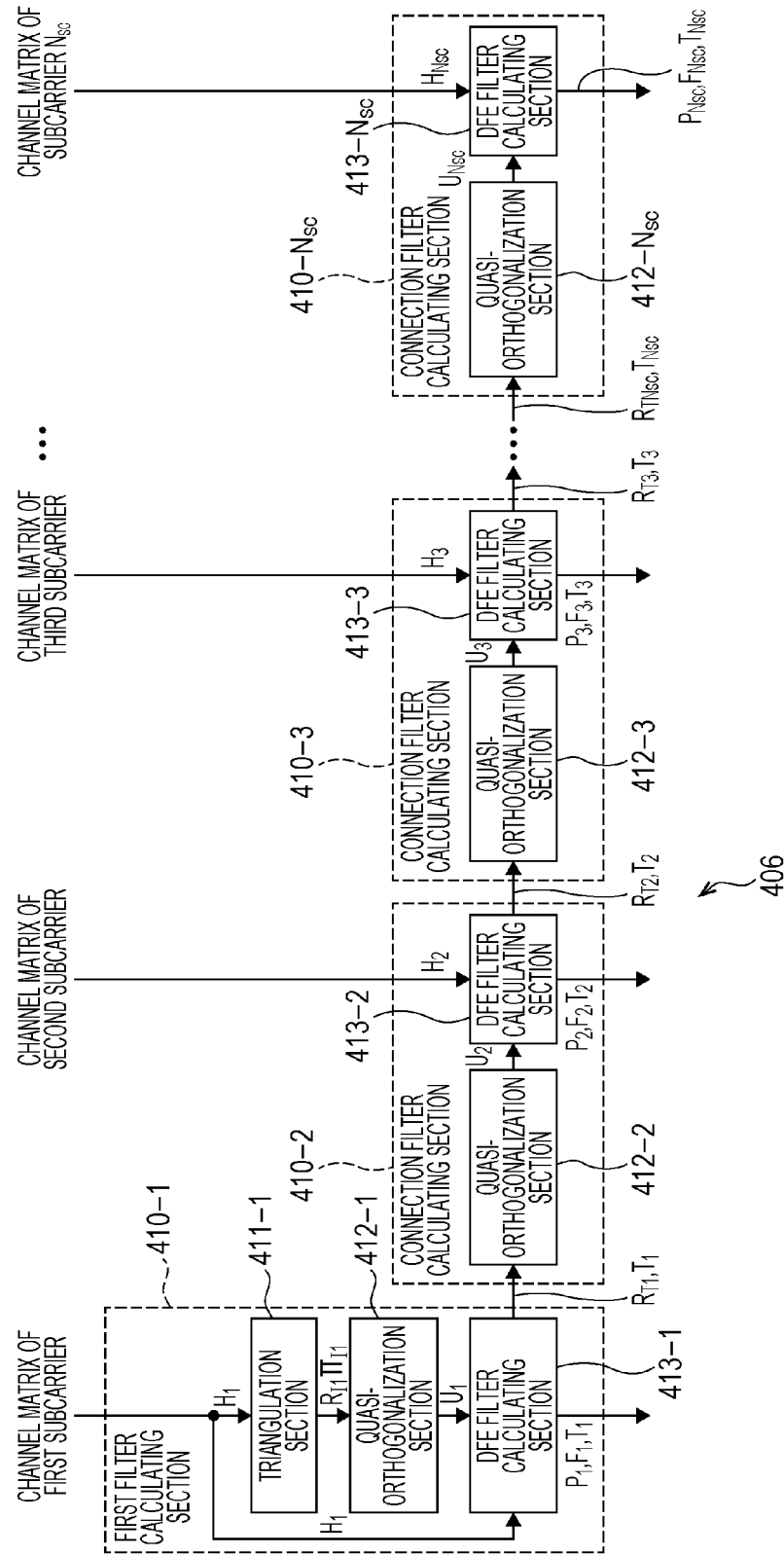
FIG. 20 illustrates a detailed block diagram of a filter calculating section 406.

FIG. 20 illustrates a detailed block diagram of the filter calculating section 406. The configuration of the filter calculating section 406 is similar to the configuration of the filter calculating section 11 according to the first embodiment (FIG. 7). Specifically, the filter calculating section 406 has a configuration in which the THP filter calculating sections 113-1 to 113-$N_{sc}$ in the filter calculating section 11 are changed to DFE filter calculating sections 413-1 to 413-$N_{sc}$, and performs the same operation as the filter calculating section 11 except for some sections.

The operational differences from the filter calculating section 11 will be described with reference to FIG. 20.

Although the triangulation section 111-1 (FIG. 7) receives a Hermitian conjugate $H_1^H$ of a channel matrix $H_1$ as an input, a triangulation section 411-1 according to this embodiment directly receives a channel matrix H. In other words, matrices $Q_{f1}$, $R_{f1}$, and $\Pi_{f1}$ output from the triangulation section 411-1 have the relationship $H\Pi_{f1}=Q_{f1}R_{f1}$ (in contrast to the relationship $H^H\Pi_{f1}=Q_{f1}R_{f1}$ in the first embodiment).

A quasi-orthogonalization section 412-1 performs the same operation as the quasi-orthogonalization section 112-1 in FIG. 6 and calculates an equivalent channel $G_1$ and a unimodular matrix $U_1$. Since the channel matrix $H_1$ is directly input to the triangulation section 411-1, $G_1$ has the relationship $G_1=H_1U_1$.

The DFE filter calculating section 413-1 calculates the equivalent channel $G_1$ from the channel matrix $H_1$ and the unimodular matrix $U_1$ and performs SQRD on the equivalent channel $G_1$ so as to calculate filters to be input to the LR-DFE section 408.

FIG. 22 illustrates detailed operation of the DFE filter calculating section 413-1. Since the operation of the DFE filter calculating section 413-1 is the same as the operation performed in each of the DFE filter calculating sections 413-2 to 413-$N_{sc}$, the operation of the DFE filter calculating section 413-1 will be generalized as the operation of the DFE filter calculating sections 413-1 to 413-$N_{sc}$. Therefore, the suffix indicating each subcarrier number will be omitted.

Zero-th line: matrices H and U are acquired as inputs.

First line: an N×N matrix G is defined, and HU is substituted into G.

Second line: SQRD is performed on G. Although the THP filter calculating section 113-$n$ according to the first embodiment performs SQRD on $G^H$ as in FIG. 13, the DFE filter calculating section 413-1 according to this embodiment performs SQRD on G (the same applies to each DFE filter calculating section 413-$n$ to be described later).

Third line: an N×N matrix T is defined, and $U\Pi_T$ is substituted into T.

Fourth line: $Q_T$, $R_T$, and T are output to the LR-DFE section.

Because the DFE filter calculating section 413-1 calculates filters corresponding to the first subcarrier, the ultimately calculated filters are defined as $QT_1$, $RT_1$, and $T_1$. These filters $QT_1$, $RT_1$, and $T_1$ are output to the LR-DFE section 408, and $RT_1$ and $T_1$ are output to a connection filter calculating section 410-2.

Subsequently, a quasi-orthogonalization section 412-2 within the connection filter calculating section 410-2 acquires $RT_1$ and $T_1$ input from a first filter calculating section 410-1. Then, similar to the quasi-orthogonalization section 412-1, the quasi-orthogonalization section 412-2 performs quasi-orthogonalization processing so as to calculate a unimodular matrix $U_2$, and outputs it to the DFE filter calculating section 413-2.

The DFE filter calculating section 413-2 performs processing shown in FIG. 26 on the basis of the input unimodular matrix $U_2$ and a channel matrix $H_2$ input from the CRS channel estimating section 407 so as to calculate filters $Q_{T2}$, $R_{T2}$, and $T_2$. The DFE filter calculating section 413-2 inputs the calculated filters $Q_{T2}$, $R_{T2}$, and $T_2$ to the LR-DFE section 408 and inputs the filters $R_{T2}$ and $T_2$ to a connection filter calculating section 410-3.

Subsequently, similar to the connection filter calculating section 410-2, the connection filter calculating section 410-3 calculates filters $Q_{T3}$, $R_{T3}$, and $T_3$ from the filters $R_{T2}$ and $T_2$ and a channel matrix $H_3$, inputs the filters $Q_{T3}$, $R_{T3}$, and $T_3$ to the LR-DFE section 408, and inputs the filters $R_{T3}$ and $T_3$ to a connection filter calculating section 410-4. Subsequently, the above processing is similarly repeated to a connection filter calculating section 410-$N_{sc}$. It is apparent from the configurations of the connection filter calculating sections 410-2 to 410-$N_{sc}$ that each of them does not have a section equivalent to the triangulation section 411-1 that performs triangulation. In other words, triangulation processing can be omitted as in the first embodiment. Therefore, the terminal device C according to this embodiment can reduce the amount of calculation required for filter calculation as compared with LR-DFE in the related art.

<LR-DFE Section 408>

Next, the operation of the LR-DFE section 408 will be described. The LR-DFE section 408 equalizes and demodulates the data signal input from the signal separating section 405 by using the filters input from the filter calculating section 406. FIG. 23 illustrates detailed operation of the LR-DFE section.

The procedure shown in FIG. 23 will now be described. The LR-DFE section 408 performs the same operation individually on the subcarriers. Therefore, the suffix indicating each subcarrier number is omitted in FIG. 23.

Zero-th line: $Q_T$, $R_T$, and T for each subcarrier are acquired as inputs from the filter calculating section 406, and a data signal y is acquired from the signal separating section 405. The data signal y is expressed by an N dimensional vertical vector in which each component is a complex number. The data signal y is a signal each component of which is received in the same resource element via each antenna 401-$n$ of the terminal device C.

First line: $y_T$ is set by multiplying $Q_T^H$ by y. Each component of $y_T$ indicates a reception signal of each stream in an equivalent channel G.

Second line: the third and fourth lines are repeated for k=N to 1.

Third line: $R_T(k, k+1:N) \times c(k+1:N)$ is substituted into $f_k$ indicating an interference signal from another stream to a k-th stream. When k=1, $f_1$=0. Moreover, c is defined as an N dimensional vector whose components are all set to zero as an initial value.

Fourth line: a value obtained by subtracting the interference signal $f_k$ to the k-th stream from a k-th component of $y_T$ is divided by a gain $R_T(k, k)$ of the k-th component, and this result is quantized based on signal-point spacing Δ of a modulation signal. The quantized value is substituted into a k-th component c(k) of the N dimensional vertical vector c.

Fifth line: the third and fourth lines are repeated for k=N to 1.

Sixth line: $d = T^{-1}c$ is calculated. In this case, d denotes an equalization result of each stream not of the equivalent channel G but of an actual channel H. Specifically, each component of d indicates an estimated value of each data signal generated by the modulating section 322-$n$ in the base station A2.

Seventh line: an n-th component of the signal d is output to the demodulating section 421-$n$.

The filter calculating section 406 according to this embodiment operates in a similar manner by adding thereto changes similar to the first to fourth modifications of the first embodiment.

In this embodiment, the number of antennas provided at the base station A2 is equal to the number N of streams, and the base station A2 transmits N streams. However, the number of antennas does not necessarily need to indicate the number of physical antennas (i.e., the actual number of antennas provided at the base station A2). For example, supposing that the base station A2 has (N+N') antennas, the base station A2 can communicate with the terminal device C assuming that the base station A2 imaginarily has N antennas based on a transmission diversity technology. Furthermore, if some of the antennas are simply not to be used, it can be considered that the base station A2 has N antennas.

Furthermore, in this embodiment, the terminal device C is described as having N antennas, which is equal to the number N of streams. Alternatively, the terminal device C may have N or more antennas. With a reception diversity technology, for example, the terminal device C may perform communication based on the assumption that it equivalently has N antennas.

<Equalization Filter Calculating Section>

The DFE filter calculating sections 413-1 to 413-$N_{sc}$ according to this embodiment and the THP filter calculating sections 113-1 to 113-$N_{sc}$ according to the first embodiment are similar to each other in that they calculate an equivalent channel G based on an input channel matrix H and an input unimodular matrix U and decompose the equivalent channel G (or $G^H$) into a product of a unitary matrix, a triangular matrix, and a permutation matrix. Therefore, a DFE filter calculating section and a THP filter calculating section will collectively be referred to as "equalization filter calculating section".

Thus, the amount of calculation in LR-THP and LR-DFE filter calculation processing can be reduced.

In each of the above embodiments, the components illustrated in the appended drawings are not limited and may be appropriately changed within the scope that exhibits the advantages of the present invention. Moreover, modifications are permissible, where appropriate, so long as they do not depart from the scope of the object of the present invention.

Furthermore, a program for realizing the functions described in the embodiments may be stored in a computer-readable storage medium. The program stored in this storage medium may be loaded into a computer system and be executed so as to perform the processing in each section. The term "computer system" in this case includes an OS or hardware, such as a peripheral device.

Furthermore, in a case where a WWW system is used, the "computer system" also includes a homepage providing environment (or a display environment).

The term "computer-readable storage medium" refers to a portable medium, such as a flexible disk, a magneto-optical disk, a ROM, or a CD-ROM, or a built-in storage device, such as a hard disk, in the computer system. Furthermore, the term "computer-readable storage medium" also includes a type that dynamically retains a program for a short period of time, like a communication line used when transmitting the program via a network, such as the Internet, or a communication line, such as a telephone line, or a type that retains a program for a certain period of time, like a volatile memory within a computer system serving as a server or a client. Furthermore, the aforementioned program may be of a type that achieves one or some of the aforementioned functions or of a type that can realize the aforementioned functions by being combined with a program already stored in the computer system.

INDUSTRIAL APPLICABILITY

The present invention can be used in a communication apparatus.

REFERENCE SIGNS LIST 1 communication system
A1 base station
B1 to B4 terminal device
C controller
F1, F2, F4, F5 connection filter calculating section
F3 first filter calculating section
11 filter calculating section
13 nonlinear precoding section
101 antenna
102 receiving section
103 GI removing section
104 FFT section
105 channel-state information acquiring section
110-1 first filter calculating section
110-2 to 110-N connection filter calculating section
111-1 triangulation section
112-1 to 112-N quasi-orthogonalization section
113-1 to 113-N THP filter calculating section
121 encoding section
122 modulating section
123 power normalizing section
124 DMRS generating section
131 interference calculating section
132 modulo calculating section
133 interference calculating section
134 linear filter multiplication section
135 conversion matrix multiplication section
141 CRS generating section
142 frame forming section
143 IFFT section
144 GI inserting section
145 transmitting section
201 antenna
202 receiving section
203 GI removing section
204 FFT section
205 signal separating section
206 CRS channel estimating section
207 DMRS channel estimating section
208 channel compensating section
209 modulo calculating section
210 demodulating section
211 decoding section
212 channel-state information generating section
213 IFFT section
214 GI inserting section
215 transmitting section All publications, patent publications, and patent application publications cited in this specification are incorporated into this specification as references.

The invention claimed is:

1. A filter calculating device comprising:
a first equalization filter calculating section configured to generate at least a first conversion matrix and a first triangular matrix based on a propagation-path state of a first channel;
a quasi-orthogonalization section configured to calculate a first unimodular matrix based on the first triangular matrix; and
a second equalization filter calculating section configured to generate at least a second conversion matrix and a second triangular matrix based on a propagation-path state of a second channel and the first unimodular matrix.

2. The filter calculating device according to claim 1, wherein the first conversion matrix is a product of a second unimodular matrix used for performing quasi-orthogonalization on the first channel and a permutation matrix calculated by the first equalization filter calculating section.

3. The filter calculating device according to claim 1, wherein the first channel and the second channel are channels that adjoin each other in a frequency domain.

4. The filter calculating device according to claim 1, wherein the first channel and the second channel are channels that adjoin each other in a time domain.

5. The filter calculating device according to claim 1, further comprising:
a third equalization filter calculating section configured to generate a third conversion matrix and a third triangular matrix based on the first unimodular matrix and a propagation-path state of a third channel that adjoins the first channel and that is different from the second channel.

6. A transmitting device configured to transmit different signals with the same frequency and at the same time to a plurality of receiving devices, the transmitting device comprising:
a filter calculating section, including:
a first equalization filter calculating section configured to generate at least a first conversion matrix and a first triangular matrix based on a propagation-path state of a first channel;
a quasi-orthogonalization section configured to calculate a first unimodular matrix based on the first triangular matrix; and
a second equalization filter calculating section configured to generate at least a second conversion matrix and a second triangular matrix based on a propagation-path state of a second channel and the first unimodular matrix;
a nonlinear precoding section configured to perform nonlinear precoding on the signal to be transmitted via the first channel based on the first conversion matrix and the first triangular matrix, and to perform nonlinear precoding on the signal to be transmitted via the second channel based on the second conversion matrix and the second triangular matrix; and
a transmitting section configured to transmit the signals having undergone the nonlinear precoding by the nonlinear precoding section.

7. The transmitting device according to claim 6, wherein a communication band is divided into a plurality of bands, and filter calculation is performed on multiple sub-bands which result from dividing the communication band into the multiple sub-bands by using the filter calculating device.

8. The transmitting device according to claim 7,
wherein the multiple sub-bands are set based on a correlation between the propagation-path states of the channels.

9. A receiving device configured to receive a plurality of different signals transmitted with the same frequency and at the same time by a transmitting device, the receiving device comprising:
   a filter calculating device, including:
      a first equalization filter calculating section configured to generate at least a first conversion matrix and a first triangular matrix based on a propagation-path state of a first channel;
      a quasi-orthogonalization section configured to calculate a first unimodular matrix based on the first triangular matrix; and
      a second equalization filter calculating section configured to generate at least a second conversion matrix and a second triangular matrix based on a propagation-path state of a second channel and the first unimodular matrix; and
   a Lattice Reduction-Decision Feedback Equalizer section configured to perform decision-feedback signal detection on the signal received via the first channel based on the first conversion matrix and the first triangular matrix, and to perform decision-feedback signal detection on the signal to be transmitted via the second channel based on the second conversion matrix and the second triangular matrix.

* * * * *